United States Patent
Chen et al.

(10) Patent No.: US 9,559,190 B2
(45) Date of Patent: Jan. 31, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chien-Hung Chen, Taichung (TW); Shen-Chieh Liu, Taichung (TW); Hobin Chen, Changhua County (TW); Wen-Lang Wu, Taichung (TW); Cherng-Chang Tsuei, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/835,291

(22) Filed: Aug. 25, 2015

(65) Prior Publication Data

US 2015/0364581 A1     Dec. 17, 2015

Related U.S. Application Data

(62) Division of application No. 14/175,677, filed on Feb. 7, 2014, now Pat. No. 9,147,767.

(51) Int. Cl.
*H01L 29/66* (2006.01)
*H01L 29/78* (2006.01)
(Continued)

(52) U.S. Cl.
CPC ... *H01L 29/66795* (2013.01); *H01L 21/02063* (2013.01); *H01L 21/31116* (2013.01);
(Continued)

(58) Field of Classification Search
CPC ............... H01L 29/66545; H01L 21/32133
See application file for complete search history.

(56) References Cited

U.S. PATENT DOCUMENTS

2005/0221601 A1   10/2005 Kawano
2012/0034773 A1   2/2012 Ott et al.

FOREIGN PATENT DOCUMENTS

KR   20070088929      8/2007
KR   100824626 B1     4/2008
(Continued)

OTHER PUBLICATIONS

Office Action issued by the Taiwan Intellectual Property Office on Oct. 22, 2015 for corresponding application 103145658.
Office action issued by Korean Intellectual Property dated Dec. 9, 2015 for Korean application 9-5-2015-086277079.
English translation of the office action issued by Korean Intellectual Property dated Dec. 9, 2015 for Korean application 9-5-2015-086277079.
(Continued)

*Primary Examiner* — David Vu
(74) *Attorney, Agent, or Firm* — WPAT, P.C., Intellectual Property Attorneys; Anthony King

(57) ABSTRACT

A semiconductor structure includes a substrate and a metal gate. The metal gate includes a metallic filling layer and disposed over the substrate. The semiconductor structure further includes a dielectric material over the metallic filling layer and separating the metallic filling layer from a conductive trace. The conductive trace is over the dielectric material. The semiconductor structure further includes a conductive plug extending longitudinally through the dielectric material and ending with a lateral encroachment inside the metallic filling layer along a direction. The lateral direction is substantially perpendicular to the longitudinal direction of the conductive plug.

20 Claims, 25 Drawing Sheets

(51) Int. Cl.
  *H01L 29/49* (2006.01)
  *H01L 21/02* (2006.01)
  *H01L 21/311* (2006.01)
  *H01L 21/3213* (2006.01)
  *H01L 21/768* (2006.01)
  *H01L 29/51* (2006.01)

(52) U.S. Cl.
  CPC .. *H01L 21/31122* (2013.01); *H01L 21/32134* (2013.01); *H01L 21/76805* (2013.01); *H01L 21/76814* (2013.01); *H01L 21/76816* (2013.01); *H01L 29/4966* (2013.01); *H01L 29/66545* (2013.01); *H01L 29/7851* (2013.01); *H01L 29/513* (2013.01); *H01L 29/517* (2013.01)

(56) References Cited

FOREIGN PATENT DOCUMENTS

| KR | 2008-0097039 | 11/2008 |
|---|---|---|
| TW | 201239960 Y | 10/2012 |

OTHER PUBLICATIONS

Translation of UPAP 2008-0097039.

Notice of Allowance and its English abstract translation issued by Korean Intellectual Property dated Dec. 9, 2015 for Korean application 10-2014-0182520.

Notice of Allowance and its English abstract translation issued by Korean Intellectual Property dated Nov. 16, 2016 for Korean application 10-2014-0182520.

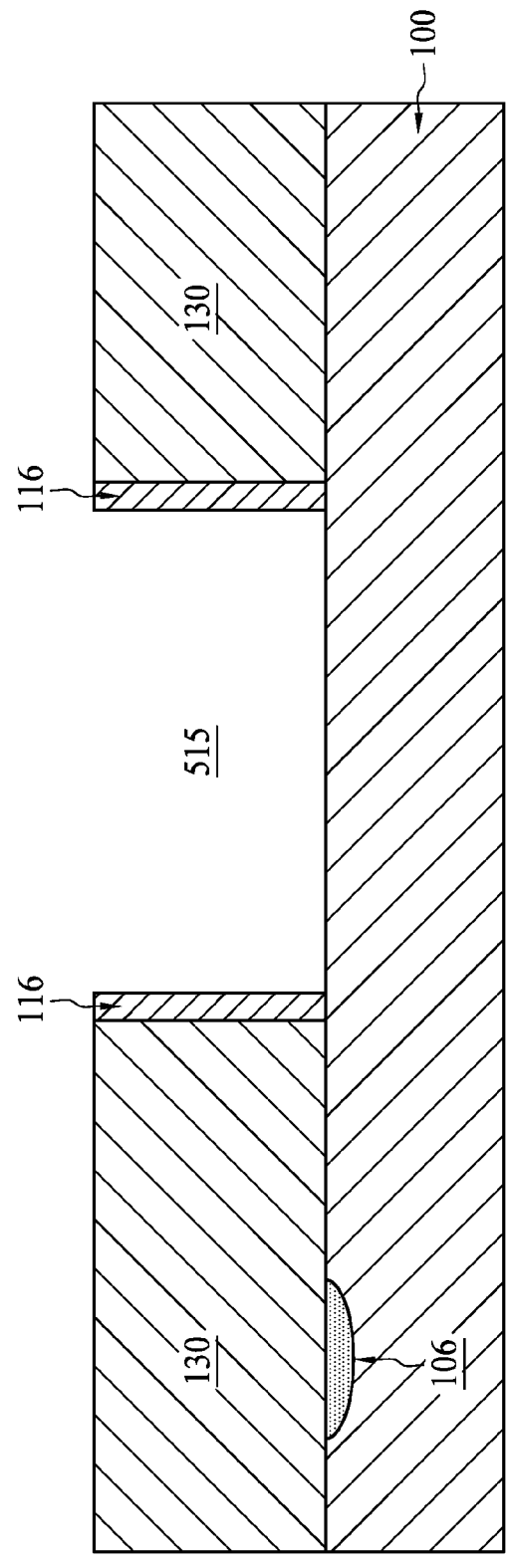

SEMICONDUCTOR STRUCTURE AND MANUFACTURING METHOD THEREOF

PRIORITY CLAIM AND CROSS-REFERENCE

This application is a divisional of U.S. application Ser. No. 14/175,677, filed Feb. 7, 2014.

FIELD

The disclosure relates to a semiconductor structure and manufacturing method thereof.

BACKGROUND

The semiconductor integrated circuit (IC) industry has experienced rapid growth. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective thickness as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process in which the final metal gate electrode is fabricated "last" which allows for reduced number of subsequent processes, including high temperature processing, that must be performed after formation of the gate.

However, problems arise when integrating a high-k/metal gate feature in a CMOS technology process flow due to various factors such as incompatibility of materials, complex processes, and thermal budgets. Therefore, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

Like reference symbols in the various drawings indicate like elements.

DETAILED DESCRIPTION OF THE INVENTION

Figure 1:
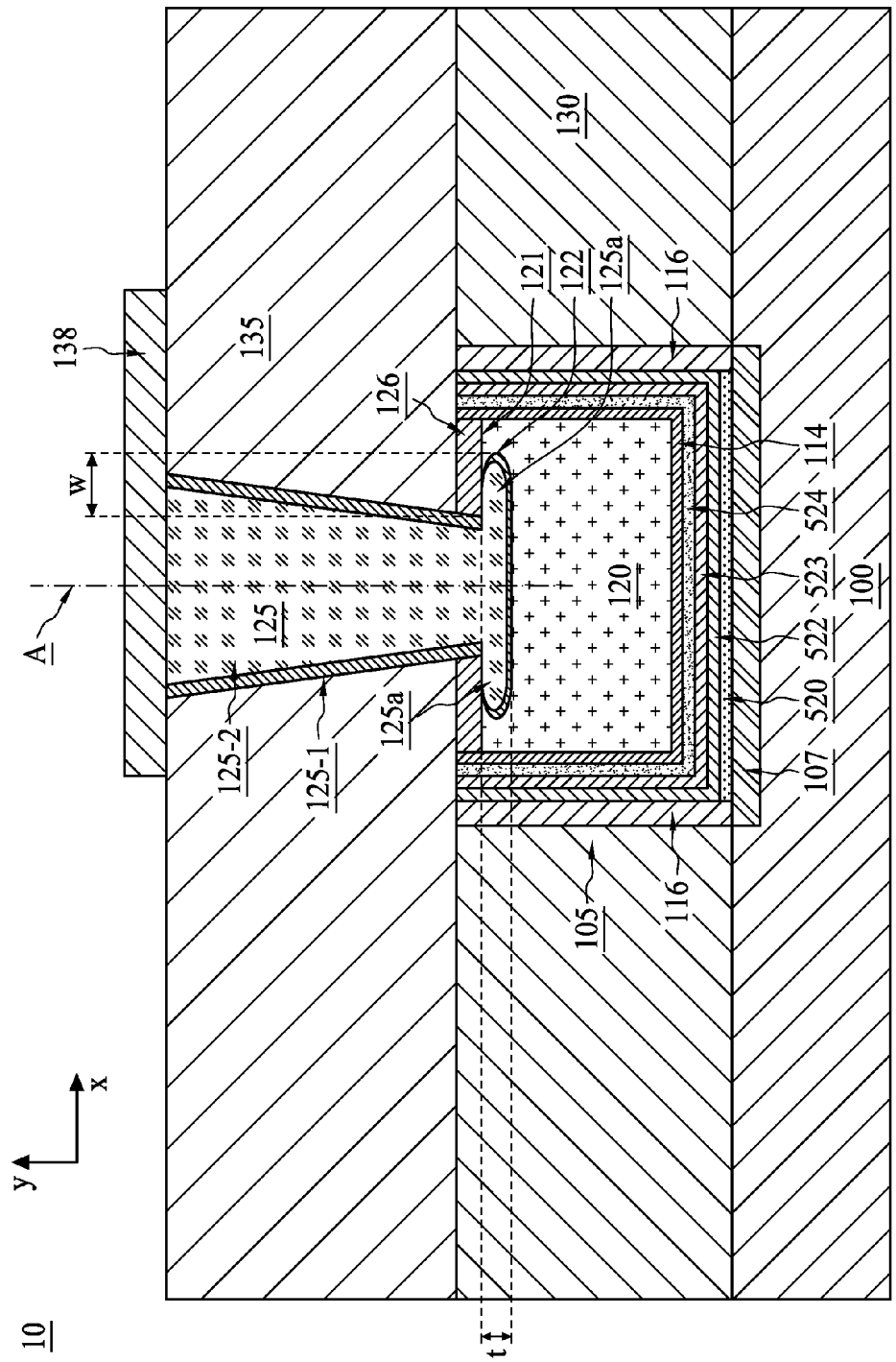
FIG. 1 is a semiconductor structure in accordance with some embodiments of the present disclosure.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

Further, it is understood that several processing steps and/or features of a device may be only briefly described. Also, additional processing steps and/or features can be added and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In semiconductor filed, contact resistance is a measurement of the area resistance between a conductive plug and a surface where the conductive plug lands on. For a semiconductor device, contact resistance is one of the critical parameters to gauge performance of the device. A low contact resistance is preferred in order to deliver a final product with short delay time and low power consumption.

In the present disclosure, a new contact engineering is provided to improve contact resistance between a conductive plug and a metal gate. In the new contact engineering, a reversed T-shaped conductive plug is designed to be in contact with the metal gate. The reversed T-shaped conducive plug is extending laterally in the metal gate in order to increase ohmic contact surface with the metal gate. Therefore, in additional to the bottom surface, a sidewall portion of the reversed T-shaped conducive plug is also surrounded by the metal gate such that the device has a lower contact resistance.

In the new contact engineering, the top surface of the metal gate is wet etched to form a recess. Debris and other electrically isolative defects are removed before a conductive material is filled in the recess thereby growing the reversed T-shaped conducive plug. Moreover, with the introduction of the new contact engineering into a wafer level process, contact resistance uniformity within wafer is improved.

FIG. 1 is a semiconductor structure 10 in accordance with some embodiments of the present disclosure. The semiconductor structure 10 includes a gate structure 105 disposed on a substrate 100. In some embodiments, the semiconductor structure 10 is a unit transistor in a semiconductor device. The substrate 100 disposed underneath the gate structure 105 is doped to act as a buried channel 107 for carrier induction while operating the unit transistor. The semiconductor structure 10 can be configured into various types of transistor such as, NMOS, PMOS, etc. based on the major carrier induced in the buried channel 107. In FIG. 1, NMOS is used as an example for illustrating some embodiments in the present disclosure, however, differences than the PMOS or other types of transistors should not be deemed as limitations. Moreover, in some embodiments, the semiconductor structure 10 is constructed on various substrate configurations such as a FIN to form a metal gate FINFET.

The gate structure 105 over the doped buried channel 107 controls major carrier concentration induced in the buried channel 107 according to the voltage applied on the gate structure 105. Conductive plug 125 is designed to transfer electrical current between a conductive trace 138 and the gate structure 105 hence applying a voltage thereon. For some embodiments as shown in FIG. 1, the conductive plug 125 is a composite structure including a barrier layer 125-1 and a plug 125-2. However, in the present disclosure, the barrier layer 125-1 and plug 125-2 are collectively called conductive plug 125. Dielectric 130, which is also called the first dielectric, is disposed on the substrate 100 and isolating the gate structure 105 from other component external to the semiconductor structure 10. Another dielectric 135, which is also called the second dielectric, is disposed over the first dielectric 130 and the gate structure 105. Either the first dielectric 130 or the second dielectric 135 is part of an interlayer dielectric (ILD). The ILD is designated to be a representative dielectric layer under the conductive trace 138 in the present disclosure. In some embodiments, the first dielectric 130 and second dielectric 135 are not distinguishable from the cross section due to similar forming condition.

In some embodiments, the substrate 100 includes a semiconductor substrate material such as a silicon substrate. In some embodiments, the substrate 100 includes silicon germanium, gallium arsenic, or other suitable semiconductor materials. In some embodiments, the substrate 100 further includes doped regions such as a P-well and/or an N-well (not shown). In some other embodiments, the substrate 100 further includes other features such as a buried layer, and/or an epitaxy layer. Furthermore, in some embodiments, the substrate 100 is semiconductor on insulator such as silicon on insulator (SOI). In other embodiments, the semiconductor substrate 100 includes a doped epi layer, a gradient semiconductor layer, and/or further includes a semiconductor layer overlying another semiconductor layer of a different type such as a silicon layer on a silicon germanium layer. In some other examples, a compound semiconductor substrate includes a multilayer silicon structure or a silicon substrate may include a multilayer compound semiconductor structure. In some embodiments, the substrate 100 may include other elementary semiconductors such as germanium and diamond. In some embodiments, the substrate 100 includes a compound semiconductor such as, silicon carbide, gallium arsenide, indium arsenide, or indium phosphide.

The gate structure 105 is a composite architecture as in FIG. 1 and includes several different films. In some embodiments, the gate structure 105 is a metal gate or a replacement metal gate. The gate structure 105 shown in FIG. 1 includes a spacer 116 which is interfaced with the first dielectric 130. In some embodiments, the spacer 116 is a single layer structure, in some other examples, the spacer 116 is a multilayer structure. Dielectric materials such as silicon nitride, silicon oxide, or silicon oxynitride are adopted to form the spacer 116. The gate structure 105 further includes an interfacial layer 520 over the substrate 100. A high-k dielectric 522 is disposed over on the interfacial layer 520. The high-k dielectric 522 also extends along the y-axis to stand proximally to the spacer 116.

A capping layer 523 is conformingly disposed over the high-k dielectric 522. In some embodiments, capping layer 523 is made with materials such as metal carbonitride, titanium nitride, or tantalum nitride. The gate structure 105 further includes a barrier layer 524 disposed over the capping layer. In some embodiments, the barrier layer 524 is configured to block some undesired ions penetrating into layers thereunder. The gate structure 105 also has a work function layer 114. In some embodiments, the work function layer 114 is a P-type work function metal (P-metal) that may be formed by ALD, PVD, CVD, or other suitable processes. Alternatively, the P-metal layer includes other suitable metals, such as WN, TaN, or Ru, that properly perform in the PFET device. In some embodiments, the P-metal layer includes a multi-metal layer structure such as TiN/WN. In some embodiments, the work function layer 114 is a stack of several layers of film.

For some embodiments as in FIG. 1, the work function layer 114 is an N-type work function metal (N-metal) may be formed by ALD, PVD, CVD, or other suitable process. Alternatively, the N-metal layer includes other suitable metals, such as TiAl, WN, TaN, or Ru, that properly perform in the PFET device. In some embodiments, the N-metal layer includes a multi-metal layer structure such as TiAl/TiN.

Like the P-metal layer, the N-metal layer is a stack of several layers of film and includes TiAl/TiN having a thickness ranging from about 10 to about 60 Å. The N-metal layer is formed by various deposition techniques such as ALD, PVD, CVD, PECVD, or other suitable technique.

The gate structure 105 further includes a metallic filling layer 120. The metallic filling layer 120 is deposited over the work function layer 114 and provides a site for the conductive plug 125 to land on. The metallic filling layer 120 has a top surface 121. A portion of the top surface 121 is in contact with a metal oxide 126. As in FIG. 1, the portion of the top surface 121 in contact with the metal oxide 126 is a substantially flat surface. Another portion of the top surface 121 is curved and recessed to be lower than the flat portion top surface. The curved recessed portion of the top surface 121 has an end 122 in an arc shape. In some embodiments, the end 122 is a semi-circular arc. The recessed portion provides a room for conductive material being filled in along a lateral direction (X-axis) in order to form the lateral encroachment 125a. Because the end 122 of the recessed portion is an arc, the lateral encroachment 125a is conforming to the end 122 to possess a rounded end interfaced with the metallic filling layer 120.

In some embodiments, the metal oxide 126 between the metallic filling layer 120 and the second dielectric 135 is transformed from a portion of the metallic filling layer 120. As in FIG. 1, it grows on top of the metal filling layer 126. In some embodiments, the metal filling layer 120 is aluminum (Al). A top portion of the aluminum filling layer 120 is transformed to an oxide 126 of the aluminum filling layer 120 such as, aluminum oxide ($Al_2O_3$).

The conductive material filled in the recessed portion forms a bottom portion of the reversed T-shaped conductive plug 125 that lands on the metal filling layer 120. The bottom portion is defined as the portion under the interface between the metal oxide 126 and the metal filling layer 120.

The portion above the interface between the metal oxide 126 and the metal filling layer 120 is the upper portion of the conductive plug 125. In some embodiments, the upper portion of the conductive plug 125 is tapered as in FIG. 1, in that there is a gradual shrinking dimension from the top end. The bottom portion of the reversed T-shaped conductive plug 125 includes a lateral encroachment 125a extending into the metal filling layer 120 along the X-axis. As in FIG. 2A, the bottom portion of the conductive plug 125 surrounded by the metal filling layer 120 has a dimension D1 and the upper portion of the conductive plug 125 surrounded by the second dielectric 135 has a dimension D2.

In the present disclosure, D1 is greater than D2. The conductive plug 125 contacts the recessed portion of top surface 121 with a dimension D1 and longitudinally (along Y-axis) extends out the gate structure 105 with a reduced dimension D2. The lateral direction (X-axis) is substantially perpendicular to the longitudinal direction (Y-axis). The contact surface between the conductive plug 125 bottom and the metal filling layer 120 is increased, thus lowering contact resistance.

In some embodiments, the bottom portion of the conductive plug 125 is in circular shape and has a diameter D1. The upper portion of the conductive plug 125 is in cylindrical or conical shape. D2 is defined as the diameter at half height of the upper portion.

Referring back to FIG. 1, the lateral encroachment 125a of conductive plug 125 has a width W. The width W is measured from the tip 122 of the recessed top surface to the interface between the conductive plug 125 and the second dielectric 135. In some embodiments, the lateral encroachment is symmetric to a central longitudinal axis A of the conductive plug 125. The central longitudinal axis A is substantially parallel to Y-axis. In some embodiments, the width W is equal to half of the difference between D1 and D2, which is defined in the following equation:

$$W = \frac{D1 - D2}{2}$$

In some embodiments, the width W is smaller than about 20 nm. In some embodiments, the width W is ranging from about 1 nm to about 50 nm. In some embodiments, the width W is ranging from about 3 nm to about 20 nm.

In addition to the larger bottom contact surface, the bottom portion of the conductive plug 125 further has a sidewall contacting the metallic filling layer 120. As in FIG. 1, the bottom portion of the conductive plug 125 has a sidewall with depth t. The depth t is a measurement to realize the distance that the conductive plug 125 extends longitudinally (along Y-axis) into the metallic filling layer 120. The sidewall of the bottom portion is surrounded by the metallic filling layer 120 such that the ohmic contact surface between the conductive plug 125 and the metal filling layer 120 is increased. Therefore, a better contact resistance between the conductive plug 125 and the metallic filling layer 120 is achieved.

In some embodiments, the depth t is ranging from about 0.5 nm to about 15 nm. In some embodiments, the depth t is ranging from about 3 nm to 11 nm. In some embodiments, the depth t is ranging from about 4 nm to about 14 nm.

The conductive trace 138 is a metal line made of copper, aluminum, tungsten, or alloy thereof. The conductive plug 125 transmits electric signals between the conductive trace 138 and the metal gate structure 105. The second dielectric 135 is over the metallic filling layer 120 and separating the metallic filling layer from the conductive trace 138. For some embodiments as in FIG. 2A, a semiconductor structure 20 has two conductive plugs. One is the reversed T-shaped conductive plug 125 landing on the metallic filling layer 120, another is the conductive plug 132 landing on a silicide region. For some embodiments, conductive plug 132 lands on silicon substrate instead of the silicide. The conductive plug 132 is separated from the metal gate structure 105 by dielectric 130 and 135, and similar to the conductive plug 125, conductive plug 132 also has a barrier layer 132-1. Different from the reversed T-shaped conductive plug 125, the conductive plug 132 has no lateral encroachment at bottom (end landing on the silicide region 106). The bottom of the conductive plug 132 has a smaller or equal dimension than the end distal to the substrate 100 (or called top of the conductive plug 132). The depth of conductive plug 132 extending into the silicide region 106 of the substrate 100 is substantially zero.

The silicide region 106 includes silicon and metallic elements such as nickel, titanium, or cobalt in order to provide a lower contact resistance between the conductive plug 132 and substrate 100. Compared to the metallic filling layer 120, the silicide region 106 is more resistant to a fluorine-containing solution. In other words, the silicide region 106 is with a greater etching selectivity than the metallic filling layer of the metal gate to a fluorine-containing solution. In some embodiments, the silicide region 106 is on a buried diffusion region of the semiconductor structure 20. The silicide region 106 is on a top surface of a source/drain region of the semiconductor structure 20 and the conductive plug 132 is connecting the source/drain region to a conductive trace (not shown) over the second dielectric 135.

In some embodiments, the conductive plug 132 extending into the substrate 100 with a depth t'. The depth t' is measured from the interface between the substrate 100 and first dielectric 130 to the bottom of the conductive plug 132. The reversed T-shaped conductive plug 125 extending into the metallic filling layer 120 with a depth t as described in aforementioned embodiments. The ratio of t to t' ranges from about 10 to about 100. For some embodiments, the ratio of t to t' is greater than about 100.

Figure 2A:
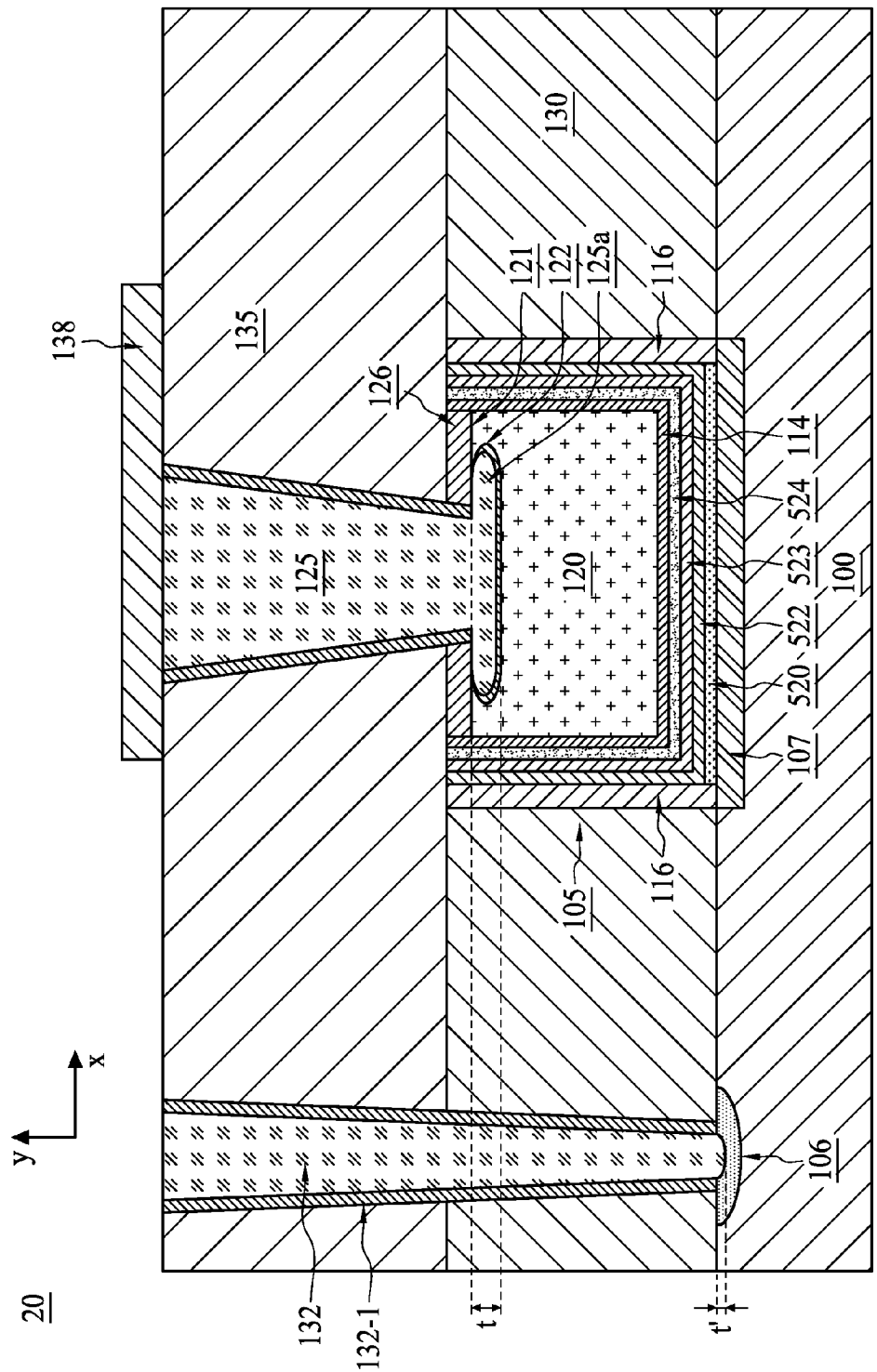
FIG. 2A is a semiconductor structure in accordance with some embodiments of the present disclosure.
Figure 2B:
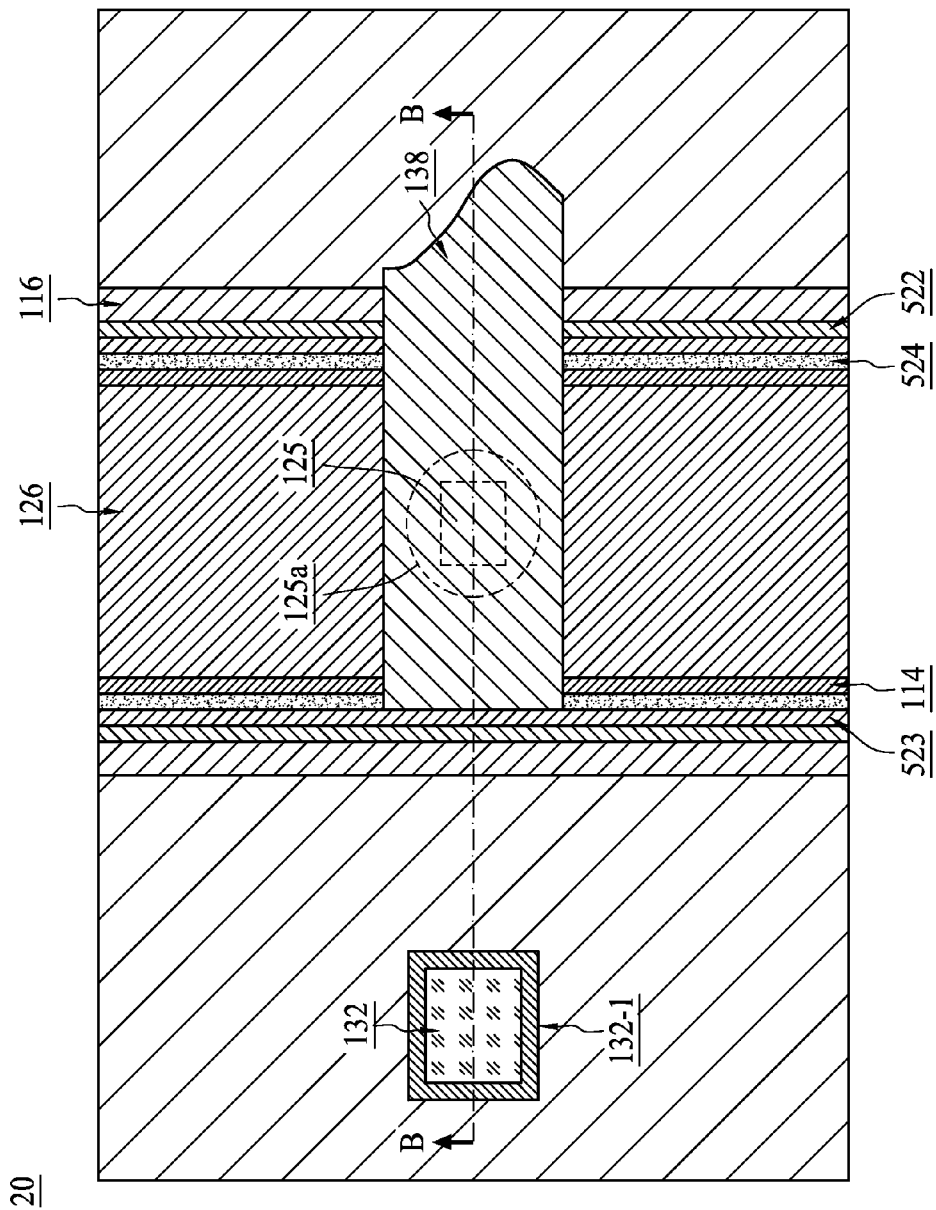
FIG. 2B is top view of FIG. 2A in accordance with some embodiments of the present disclosure.
Figure 2C:
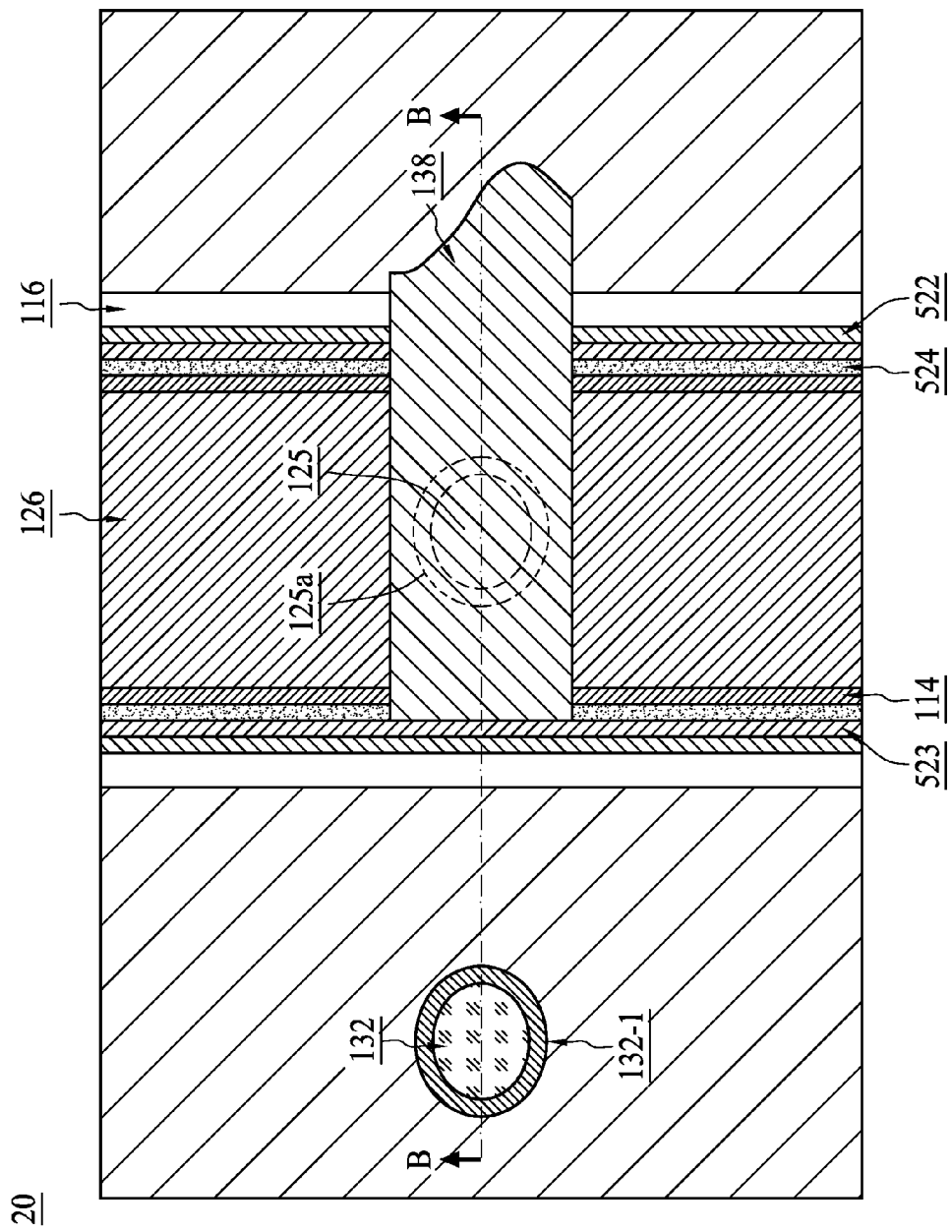
FIG. 2C is top view of FIG. 2A in accordance with some embodiments of the present disclosure.

FIG. 2B is the semiconductor structure 20 illustrated from a top view perspective. The semiconductor structure 20 in FIG. 2A is a cross sectional view along line BB. The dotted lines represent the conductive plug 125 and lateral encroachment 125a under conductive trace 138. Both the conductive plug 125 and another conductive plug 132 are in quadrilateral shape. However, for some embodiments as in FIG. 2C, the conductive plug 125 and 132 are in circular shape from the top view.

Figure 3A:
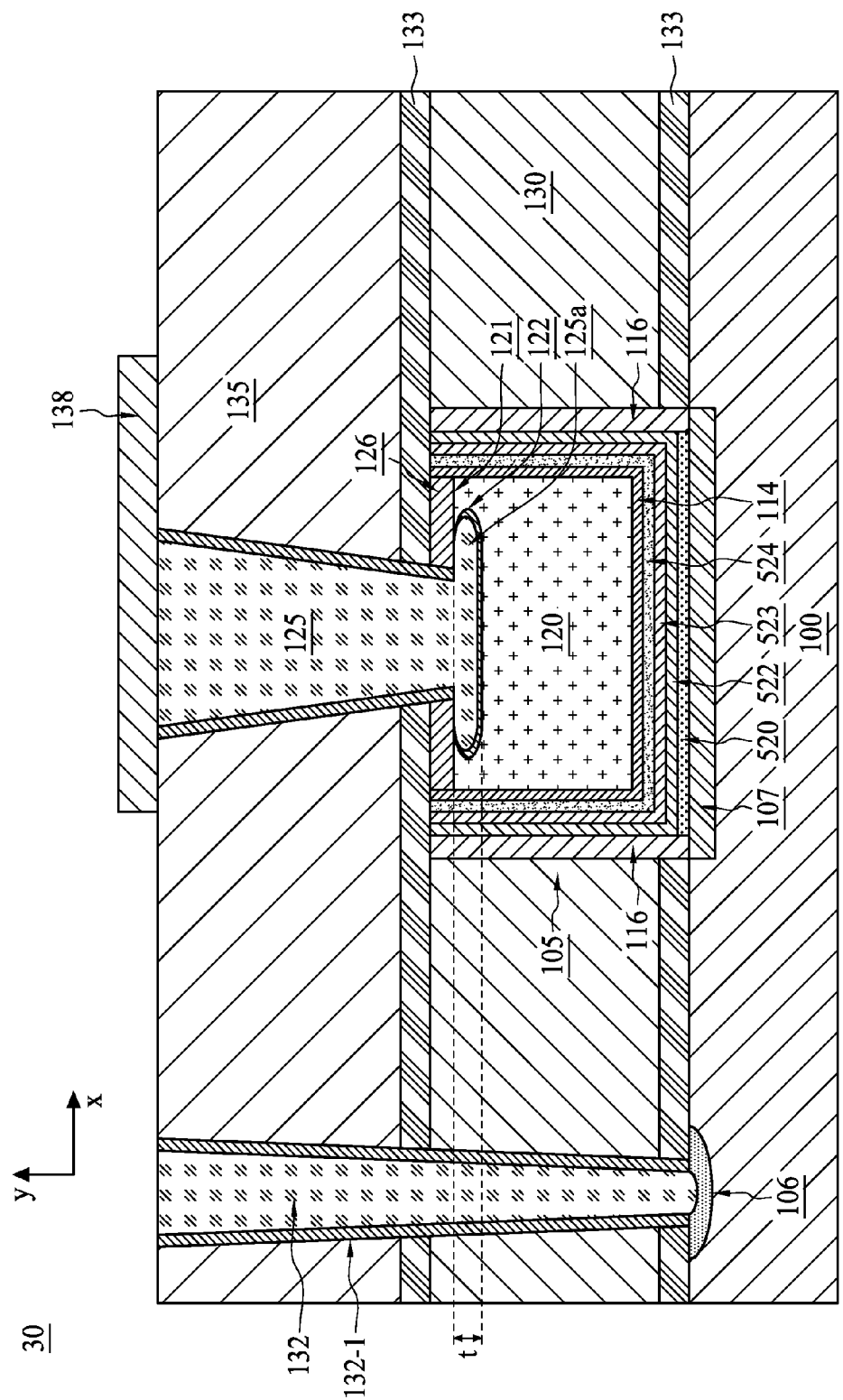
FIG. 3A is a semiconductor structure in accordance with some embodiments of the present disclosure.
Figure 3B:
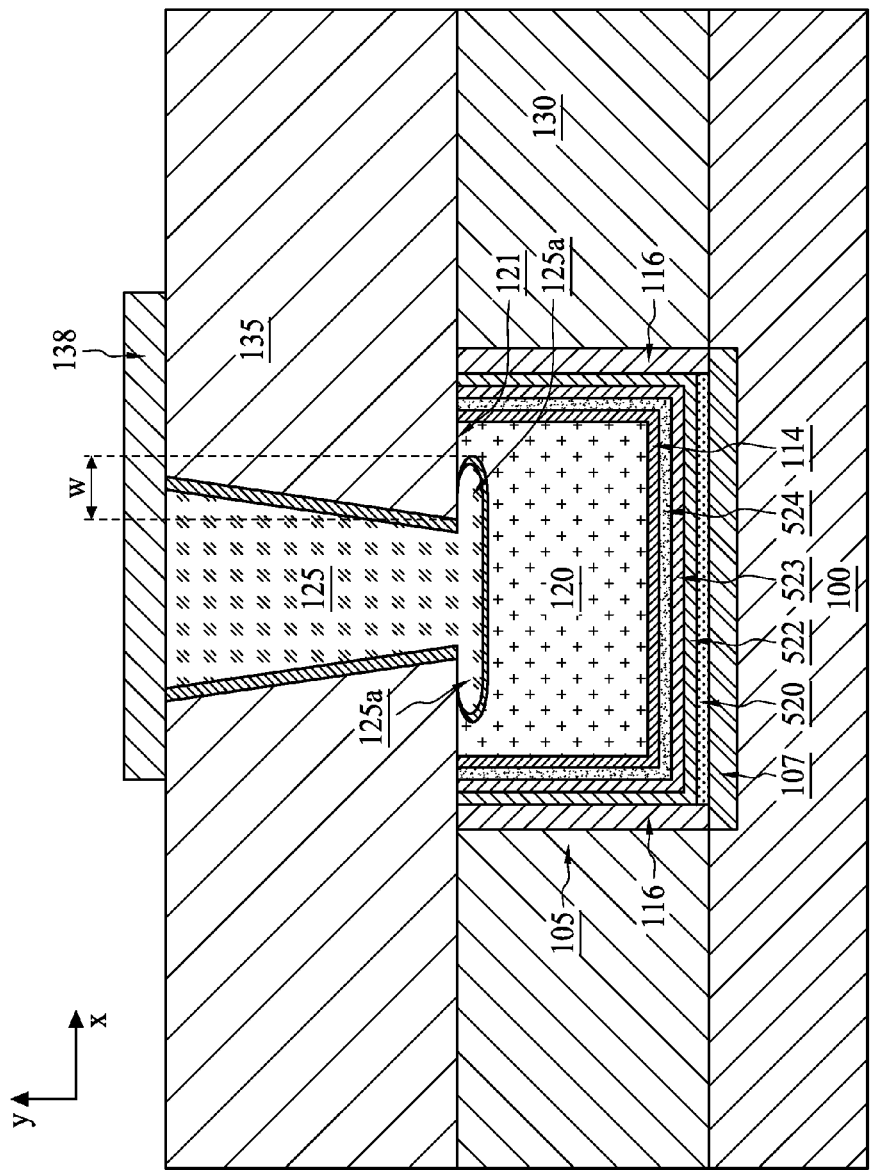
FIG. 3B is a semiconductor structure in accordance with some embodiments of the present disclosure.

FIG. 3A is a semiconductor structure 30 that is similar to the semiconductor structure 20. Additionally, the semiconductor structure 30 further has an etch stop layer (ESL) in the film stack. As in FIG. 3, there is an etch stop layer 133 disposed between the substrate 100 and dielectric 130 and an etch stop layer 133 disposed between the dielectric 135 and dielectric 130. In some embodiments, the ESL is made with nitride compound such as silicon nitride or silicon oxynitride.

In some embodiments, there is substantially no metal oxide or only native oxide of the metallic filling layer 120 interposed between the ILD dielectric and the metallic filling layer. As in FIG. 3B, a semiconductor structure 40, which is similar to the semiconductor structure 10 in FIG. 1, includes a second dielectric 135 directly disposed on the metallic filling layer 120. A portion of the bottom portion of the conductive plug 125 is covered by the second dielectric 135.

Figure 4:
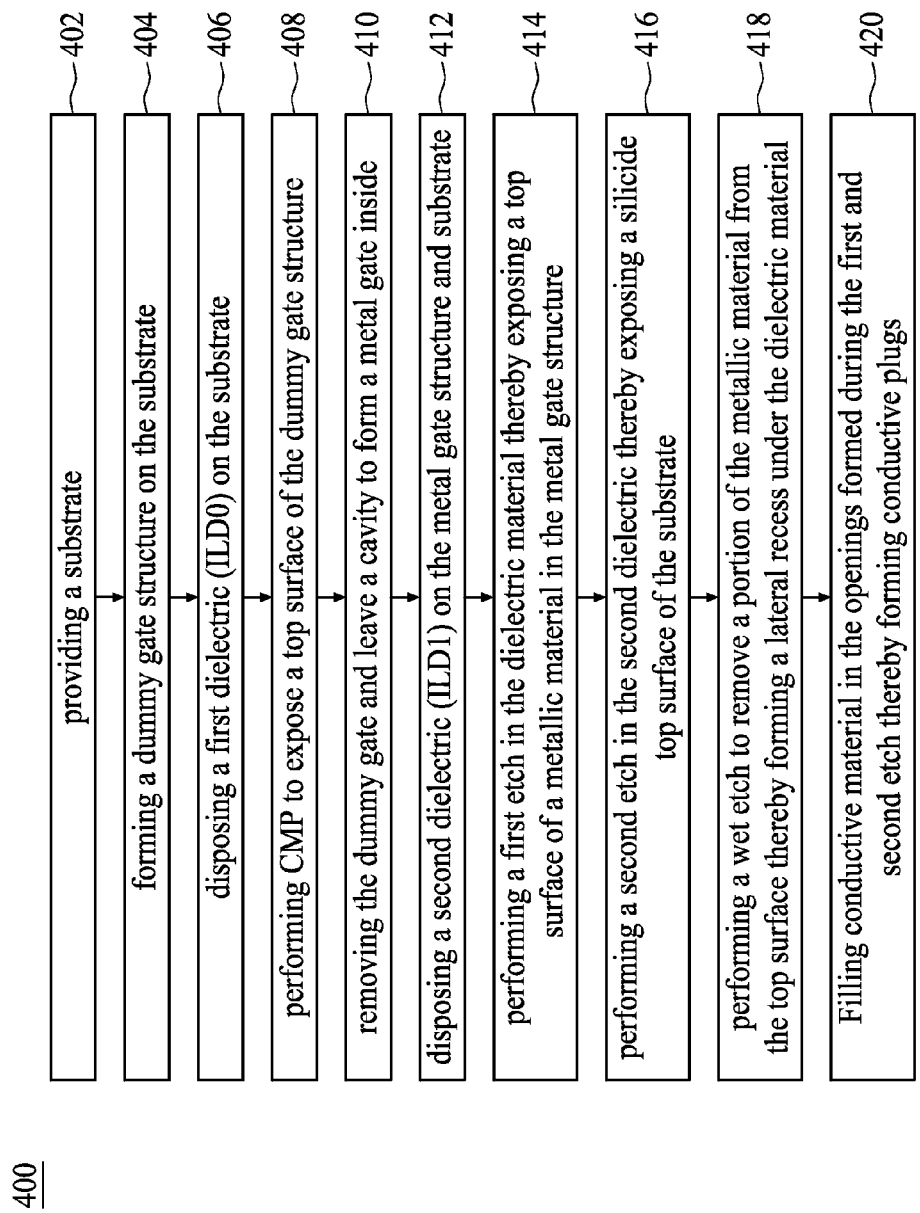
FIG. 4 is a flowchart of a method for fabricating a semiconductor structure with a reversed T-shaped conductive plug according to various aspects of the present disclosure.
Figure 5A:
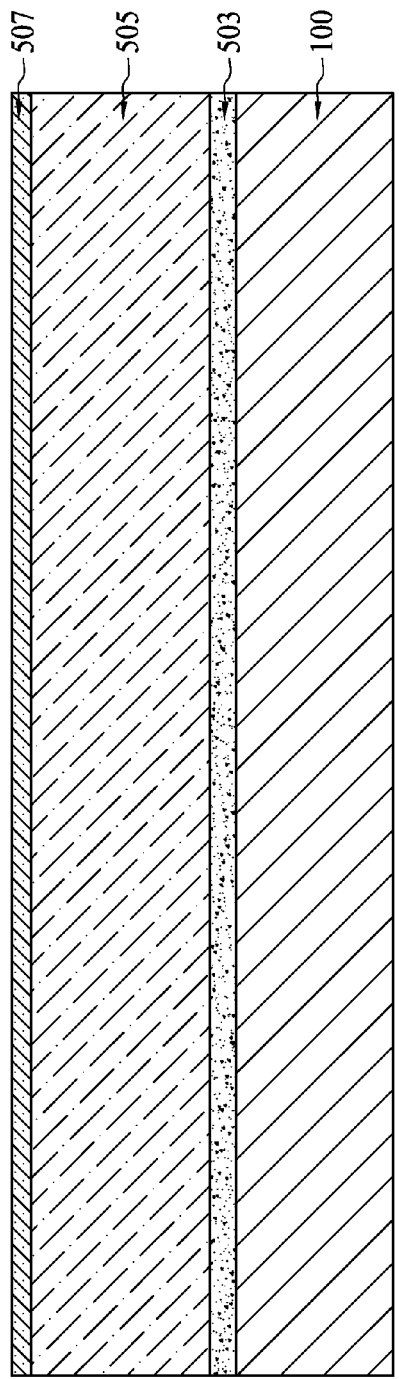
FIG. 5A to 5S respectively is a semiconductor structure corresponding to one operation stage of a manufacturing method according to various aspects of the present disclosure.
Figure 5B:
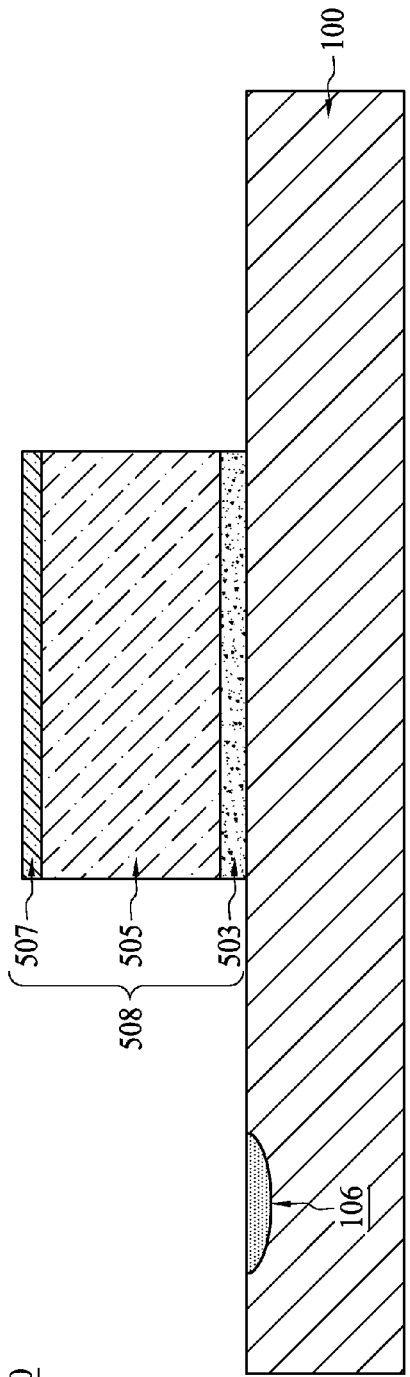

Referring to FIG. 4, illustrated is a flowchart of a method 400 for fabricating a semiconductor structure 20 with a reversed T-shaped conductive plug as shown in FIG. 2A. Referring also to FIGS. 5A to 5S, illustrated are cross-sectional views of the semiconductor structure 20 at various stages of fabrication according to the method 400 of FIG. 4. It should be noted that part of the semiconductor structure 50 may be fabricated with a CMOS process flow. Accordingly, it is understood that additional processes may be provided before, during, and after the method 400 of FIG. 4. It is understood that FIG. 5A to FIG. 5S have been simplified for the clarity to better understand various embodiments of the present disclosure. The semiconductor structure 50 may be fabricated in a high-k dielectric/metal gate last process (also referred to as a replacement poly gate process (RPG)). In a high-k dielectric/metal gate last process, a dummy dielectric and dummy poly gate structure are initially formed, and is followed a typical CMOS process flow until deposition of an inter-level dielectric (ILD). The dummy dielectric and dummy poly gate structure may then be removed and replaced with a high-k gate dielectric/metal gate structure.

The method 400 includes operation 402 in which a substrate is provided. The method 400 continues with operation 404 in which a dummy gate structure is formed on the substrate. The method 400 continues with operation 406 in which a first dielectric (ILD0) is disposed on the substrate. The method 400 continues with operation 408 in which a chemical mechanical planarization (CMP) operation is performed to expose a top surface of the dummy gate structure. The method 400 continues with operation 410 in which the dummy gate is removed to leave a cavity for a metal or replacement gate to fill in thereby forming a metal gate structure.

The method 400 continues with operation 412 in which a second dielectric (ILD1) is disposed over the metal gate structure and the substrate. The method 400 continues with operation 414 in which a first etch is performed in the first dielectric thereby exposing a top surface of a metallic material in the metal gate structure. The method 400 continues with operation 416 in which a second etch is performed in the second dielectric thereby exposing a silicide surface of the substrate. The method 400 continues with operation 418 in which a wet etch is performed to remove a portion of the metallic material from the top surface thereby forming a lateral recess under the dielectric material. The method 400 continues with operation 420 in which conductive material is filled in openings formed during the first and second etch thereby forming conductive plugs.

In FIG. 5A, a substrate 100 such as a silicon substrate is provided. In some embodiments, the substrate 100 includes silicon germanium, gallium arsenic, or other suitable semiconductor materials. In some embodiments, the substrate 100 further includes doped regions such as a P-well and/or an N-well (not shown). In some other embodiments, the substrate 100 further includes other features such as a buried layer, and/or an epitaxy layer. Furthermore, in some embodiments, the substrate 100 is semiconductor on insulator such as silicon on insulator (SOD. In other embodiments, the semiconductor substrate 100 includes a doped epi layer, a gradient semiconductor layer, and/or further includes a semiconductor layer overlying another semiconductor layer of a different type such as a silicon layer on a silicon germanium layer. In other embodiments, the semiconductor substrate 100 includes a fin structure which is a regrowth region. In some other examples, a compound semiconductor substrate includes a multilayer silicon structure or a silicon substrate may include a multilayer compound semiconductor structure. In some embodiments, the substrate 100 may include other elementary semiconductors such as germanium and diamond. In some embodiments, the substrate 100 includes a compound semiconductor such as, silicon carbide, gallium arsenide, indium arsenide, or indium phosphide.

The semiconductor structure 20 further includes an isolation structure such as a shallow trench isolation (STI) feature (not shown) formed in the substrate 100 for isolating active regions and of the substrate. In some embodiments, the isolation structure includes a local oxidation of silicon (LOCOS) configuration. The isolation structure includes silicon oxide, silicon nitride, silicon oxynitride, fluoride-doped silicate (FSG), and/or a low k dielectric material known in the art. The active regions include n-type metal-oxide-semiconductor field effect transistors (e.g., NMOS-FET or NFET) and p-type metal-oxide-semiconductor field effect transistors (e.g., PMOSFET or PFET). Although only one gate structure is illustrated, it is understood that the semiconductor structure 20 may include a number of gate structures for NFETs and PFETs including short channel and long channel transistors.

In FIG. 5A, according to some embodiments of present disclosure, the semiconductor structure 20 includes a sacrificial dielectric layer 503 formed on the substrate 100. The sacrificial dielectric layer 503 includes an oxide formed either by thermal or chemical vapor deposition. In some embodiments, the sacrificial dielectric layer 503 is formed in single wafer chamber equipment. In some embodiments, the sacrificial dielectric layer 503 is formed in batch mode furnace. The sacrificial dielectric layer 503 includes a thickness ranging from about 10 to about 100 Angstrom (Å). The semiconductor structure 50 also includes a dummy gate 505 formed over the sacrificial dielectric layer 503 by a suitable deposition process. In some embodiments, the dummy gate 505 is formed over the sacrificial dielectric layer 503 by deposition. In some embodiments, silane (SiH4), di-silane (Si2H6), or di-chlorosilane (SiCl2H4) may be used as a chemical gas in a chemical vapor deposition (CVD) process to form the dummy gate 505. The dummy gate 505 may include a thickness ranging from about 150 to about 2500 Å.

In some embodiments, the semiconductor structure 20 further includes a hard mask layer 507 formed on the dummy gate 505. In some embodiments, the hard mask layer includes silicon nitride, silicon oxynitride, silicon carbide, and/or other suitable dielectric materials, and may be formed using a method such as chemical vapor deposition (CVD) or physical vapor deposition (PVD or sputtering). The hard mask layer includes a thickness ranges from about 100 Å to about 400 Å. In some embodiments, an antireflective coating layer (ARC) is formed on the hard mask layer to enhance a photolithography process for patterning a photoresist layer. For example, a patterned photoresist layer (not shown) may be formed on the hard mask layer. After the patterned photoresist layer is formed, a gate structure 508 (in FIG. 5B) is formed by a dry etch, wet etch, or combination dry and wet etch process. Accordingly, the gate structure 508 may include a sacrificial dielectric layer 503, a dummy gate 505, and a hard mask 507 as shown in FIG. 5B.

After formation of the gate structure (e.g., gate etching or patterning), the semiconductor structure 20 undergoes additional CMOS processing to form various features of the NFET and PFET devices as is known in the art. Thus, various features are only briefly discussed herein. In some embodiments, the various features include, lightly doped source/drain regions (n-type and p-type LDD), source/drain (S/D) regions, contact etch stop layer (CESL). It should be noted that strained structures such as silicon germanium (SiGe) and silicon carbide (SiC) features may be formed in the PFET and NFET devices, respectively, to boost and enhance the performance of the devices. In FIG. 5B, a silicide region 106 is formed in the substrate 100.

Figure 5C:
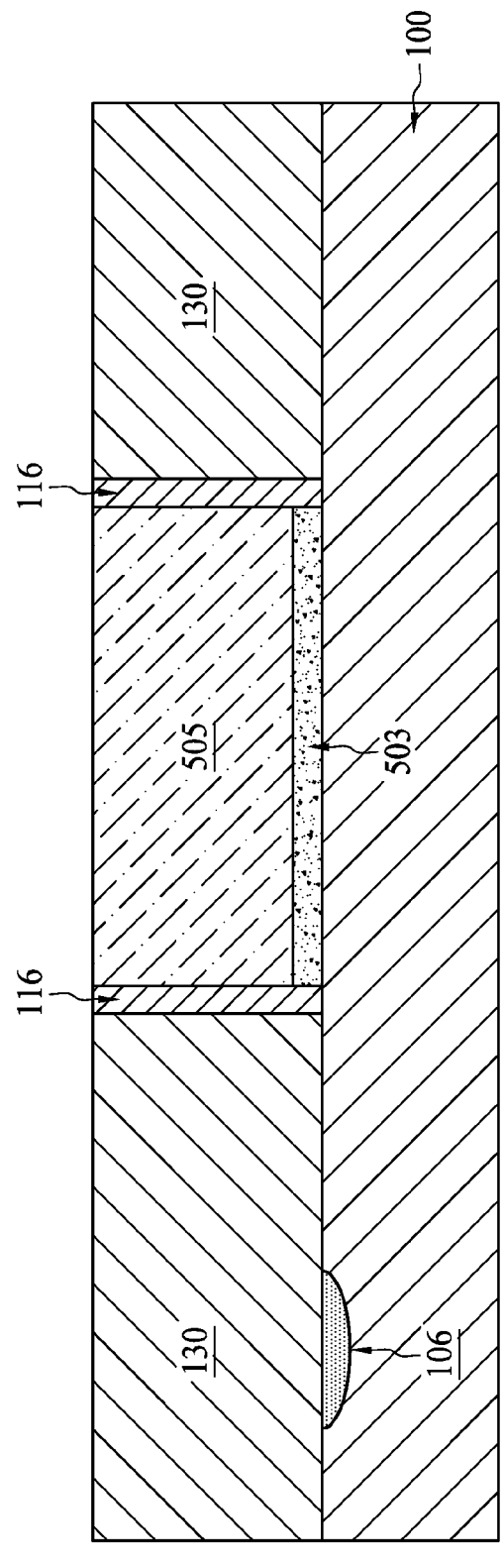

In some embodiments as in FIG. 5C, spacers 116, and a dielectric (ILD0) 130 are formed. The dielectric 130 includes a dielectric material made with doped silicon glass such as phosphorous silicon glass (PSG) or boron phosphorous silicon glass (BPSG). In some embodiments, the dielectric material includes silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the first dielectric 130 includes a high density plasma (HDP) dielectric material (e.g., HDP oxide) and/or a high aspect ratio process (HARP) dielectric material (e.g., HARP oxide). The first dielectric 130 includes any suitable thickness. In the present embodiment, dielectric 130 includes a thickness of about 2000~6000 Å. It is understood that the dielectric 130 may include one or more dielectric materials and/or one or more dielectric layers. The dielectric 130 is planarized by a chemical-mechanical-polishing (CMP) process until a top portion of the dummy gate 505 is exposed as illustrated in FIG. 5C. The CMP process includes a high selectivity to provide a substantially planar surface for the dummy gate 505, spacers 116, and dielectric 130. In some embodiments, the CMP process has low dishing and/or metal erosion effect.

In FIG. 5D, a gate replacement process is performed. The dummy gate 505 and the sacrificial dielectric layer 503 are removed by a dry etch, wet etch, combination dry and wet etch, or other suitable process. The dummy gate 505 and sacrificial dielectric layer 503 in FIG. 5C are removed in a one or more etching processes and the etching process includes multiple etching operations. For example, a first wet etch process is used to remove the dummy gate 505. The first wet etch process may include exposure to a hydroxide containing solution (e.g., ammonium hydroxide), deionized water, and/or other suitable etchant solutions. A second wet etch process is used to remove the sacrificial dielectric layer 503. The second wet etch process includes exposure to a buffered HF solution or a buffered oxide etchant (BOE). The second wet etch process may selectively remove the sacrificial dielectric layer 503 and stops at the substrate 100, thereby forming a trench 515 in the gate structure. It is understood that other etching chemicals may be used for selectively removing the dummy dielectric and dummy poly gate.

Figure 5E:
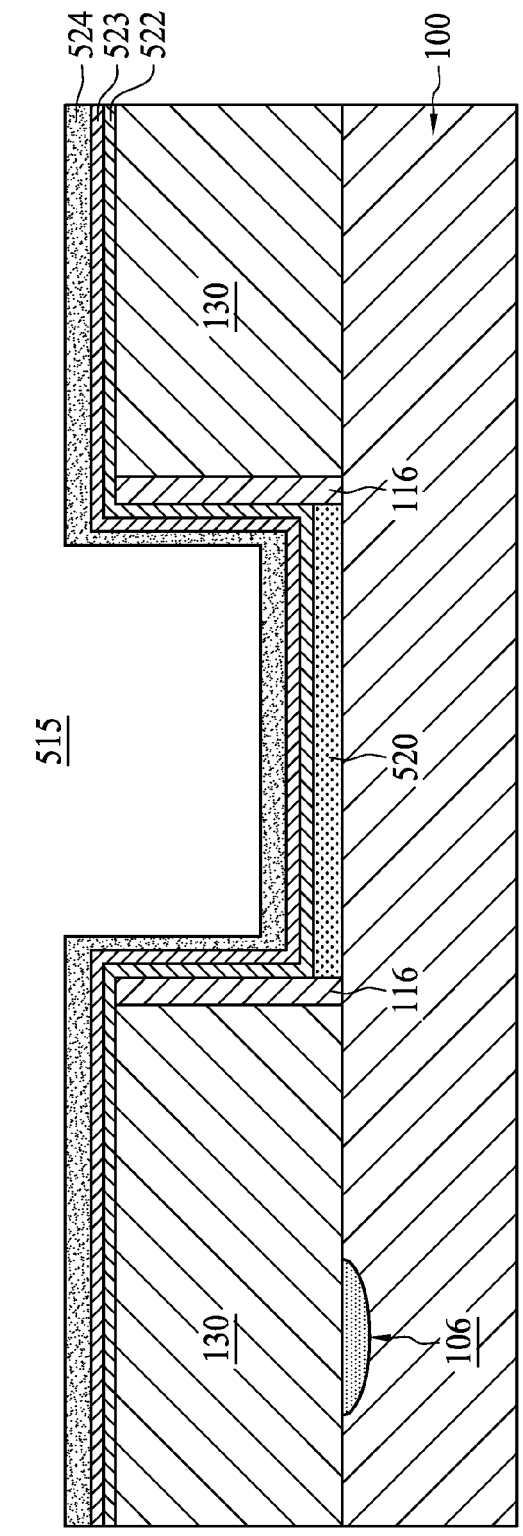

In FIG. 5E, an interfacial layer 520, a high-k dielectric layer 522, a capping layer 523 and a barrier layer 524 are formed to partially fill in the trench 515. The interfacial layer 520 may include a silicon oxide (SiO2) layer (e.g., thermal or chemical oxide formation) having a thickness ranging from about 2 to about 25 Å. In some embodiments, the interfacial layer 520 includes HfSiO or SiON formed by atomic layer deposition (ALD), chemical vapor deposition (CVD), physical vapor deposition (PVD), thermal oxidation and nitridation, plasma oxidation and nitridation, or combinations thereof. In some embodiments, an Hf film may be formed on a thermal oxide by ALD, CVD, or PVD, and then oxidized by thermal oxygen to form HfSiO. In other embodiments, an Hf film may be formed by ALD, CVD, or PVD in a reactive oxygen and H2O ambient.

The high-k dielectric layer 522 is formed on the interfacial layer 520. In some embodiments, the high-k dielectric layer 522 is formed by ALD, CVD, metalorganic CVD (MOCVD), PVD, plasma enhanced CVD (PECVD), plasma enhance ALD (PEALD), thermal oxidation, combinations thereof, or other suitable technique. In some embodiments, the high-k dielectric layer 522 includes a thickness ranging from about 5 to about 30 Å. The high-k dielectric layer 522 includes a binary or ternary high-k film such as HfOx. In some embodiments, the high-k dielectric layer 522 includes other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfSiO, (Ba,Sr)TiO3 (BST), Al2O3, Si3N4, oxynitrides, or other suitable materials.

The capping layer 523 is formed over the high-k dielectric layer 522. In some embodiments, the capping layer 523 includes metal carbonitride, titanium nitride, tantalum nitride. The capping layer 523 is formed by various deposition techniques such as ALD, PVD, CVD, PECVD, or other suitable technique.

The barrier layer 524 is formed over the capping layer 523. In some embodiments, the barrier layer 524 includes TiN or TaN having a thickness ranging from about 5 to about 30 Å. The barrier layer 524 functions as a barrier to protect the capping layer 523. The barrier layer 524 is formed by various deposition techniques such as ALD, PVD, CVD, PECVD, or other suitable technique.

Figure 5F:
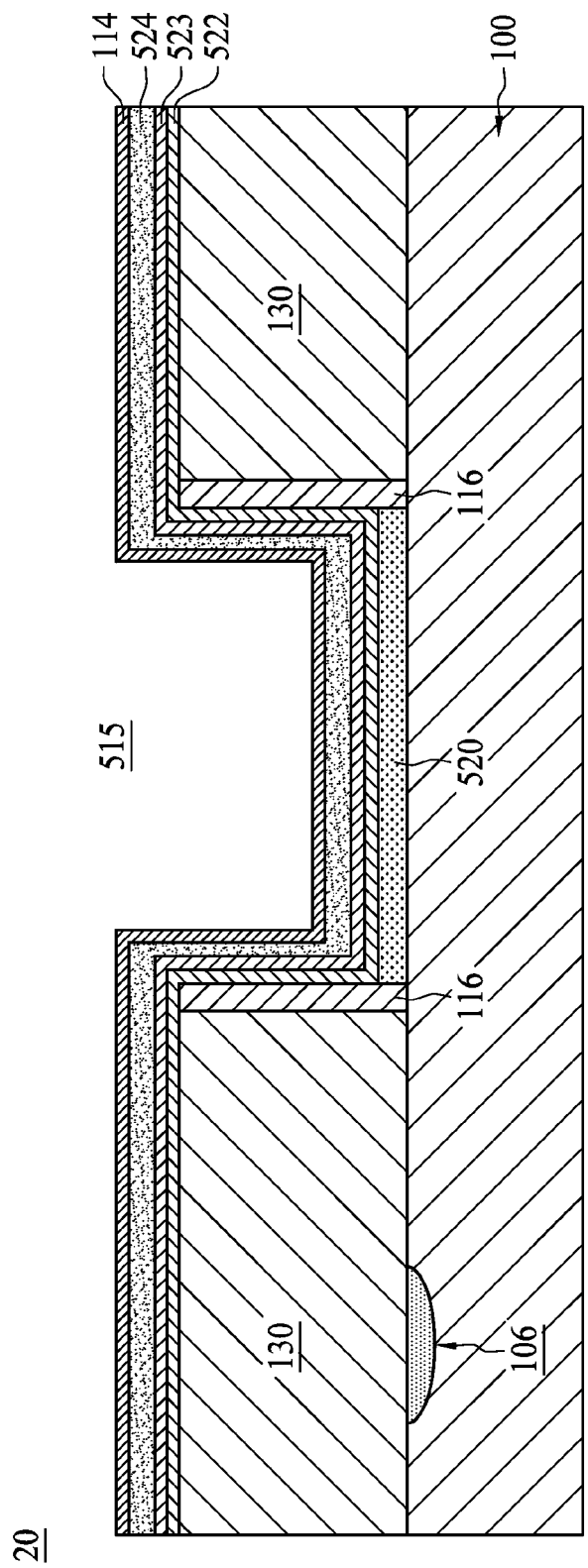

In FIG. 5F, the work function layer 114 is formed over the barrier layer 524. For some embodiments, the work function layer 114 is a P-type work function metal (P-metal) formed over the barrier layer 524. The P-metal layer may be formed by ALD, PVD, CVD, or other suitable process. Alternatively, the P-metal layer includes other suitable metals, such as WN, TaN, or Ru, that properly perform in the PFET device. In some embodiments, the P-metal layer includes a multi-metal layer structure such as TiN/WN.

In other embodiments, the work function layer 114 is an N-type work function metal (N-metal) formed over the barrier layer 524. The N-metal includes TiAl. The N-metal is formed by ALD, PVD, CVD, or other suitable process. In some embodiments, the N-metal layer includes other suitable metals, such as Ti, Ag, Al, TiAlN, TaC, TaCN, TaSiN, Mn, or Zr that perform in the NFET device.

Figure 5G:
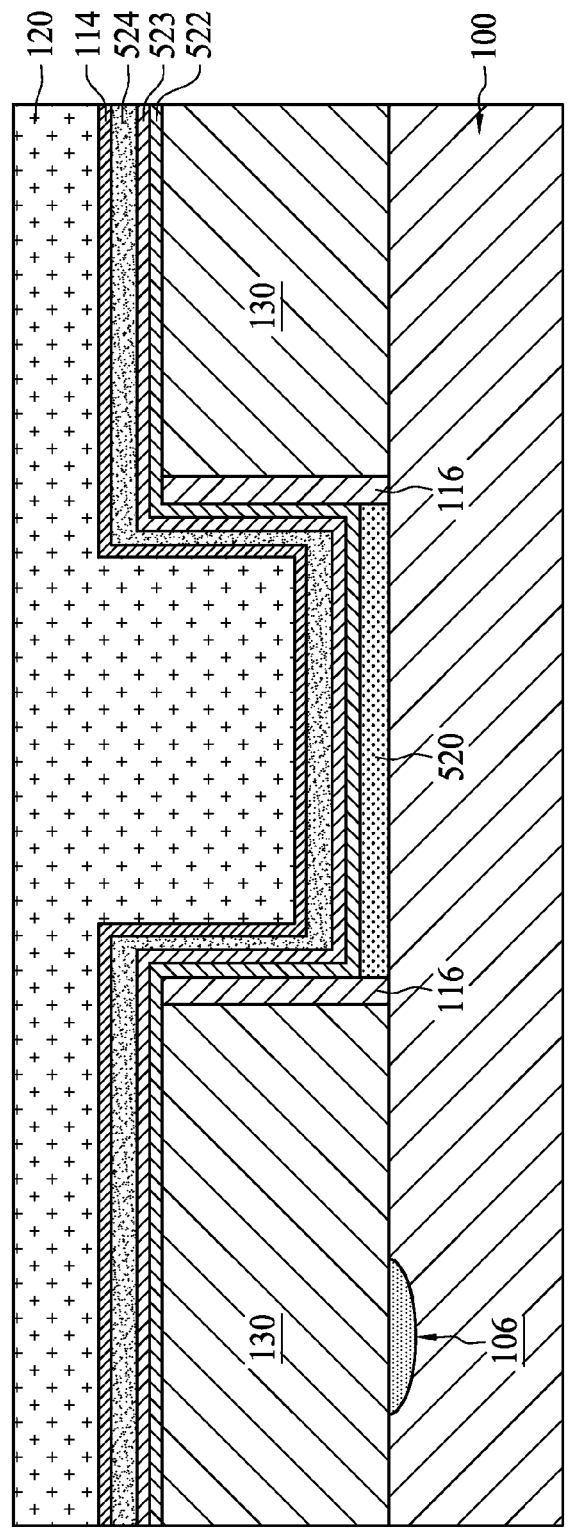

In FIG. 5G, a metallic filling layer 120 is formed to fill in a remainder of the trench 515. The metallic filling layer 120 includes any metal material suitable for forming a metal gate or portion thereof, including work function layers, liner layers, interface layers, seed layers, adhesion layers, barrier layers, etc.

metallic filling layer 120 may be a composite structure including a layer of titanium (Ti) deposited to function as a wetting layer for a subsequent aluminum (Al) fill. The Ti layer is formed by PVD or other suitable process. A layer of Al is formed on the Ti layer to fill in the remainder of the trench 515. The Al layer is formed by forming a first Al layer by CVD and then forming a second Al layer by PVD. In some other embodiments, the fill metal includes tungsten (W), or other suitable metal material.

Figure 5H:
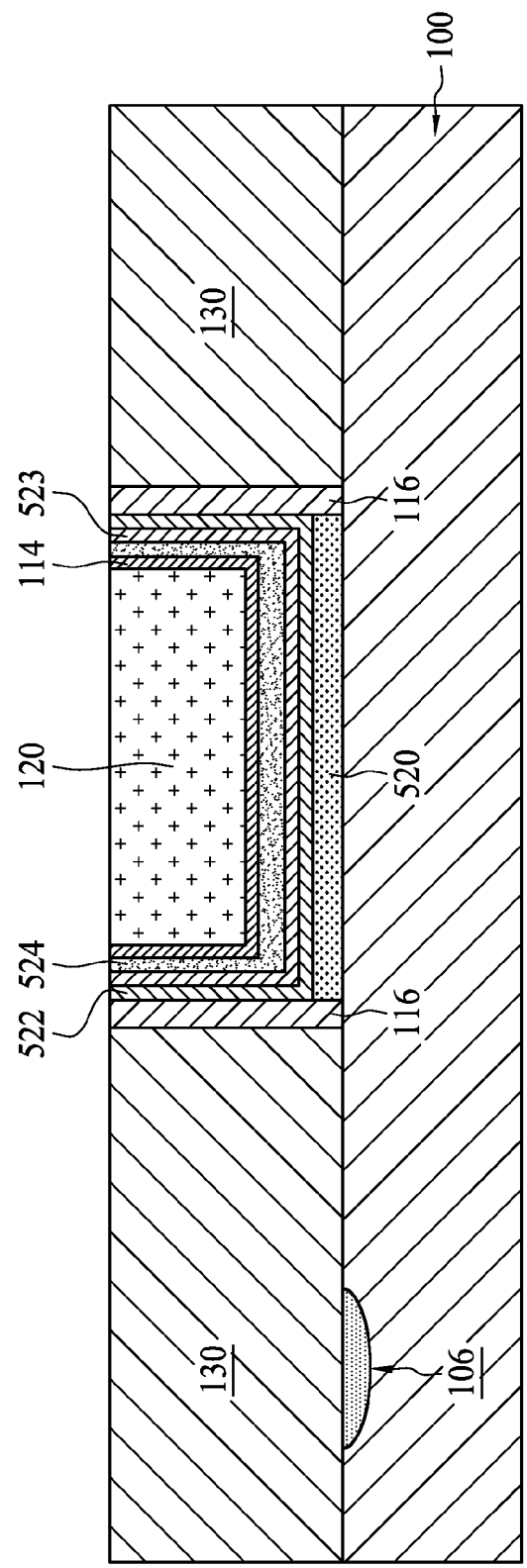
Figure 5I:
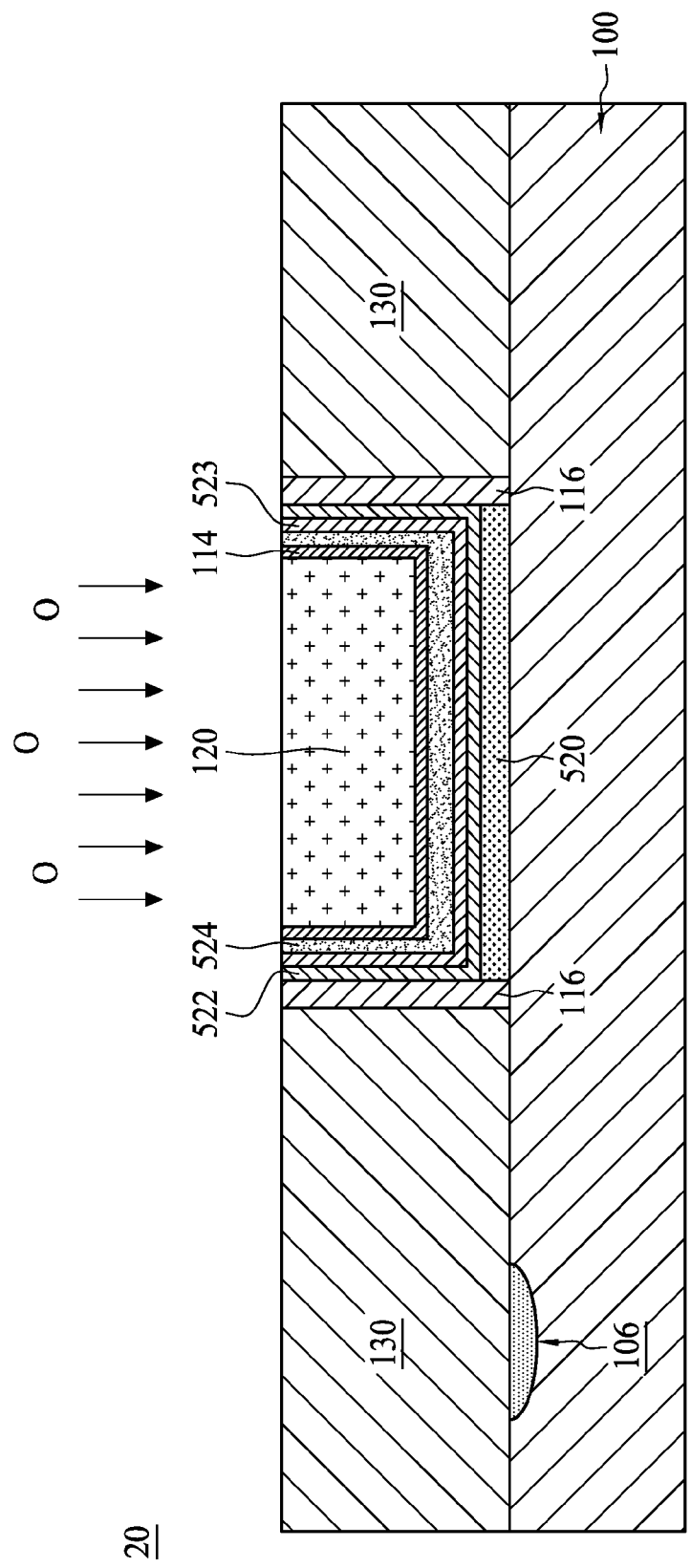

A chemical mechanical polishing (CMP) process is performed. In FIG. 5H, a CMP is performed on the metallic filling layer 120 to remove the excess metal material to form a gate structures (combination of 520 to 524, 114 and 120) and dielectric 130.

Figure 5J:
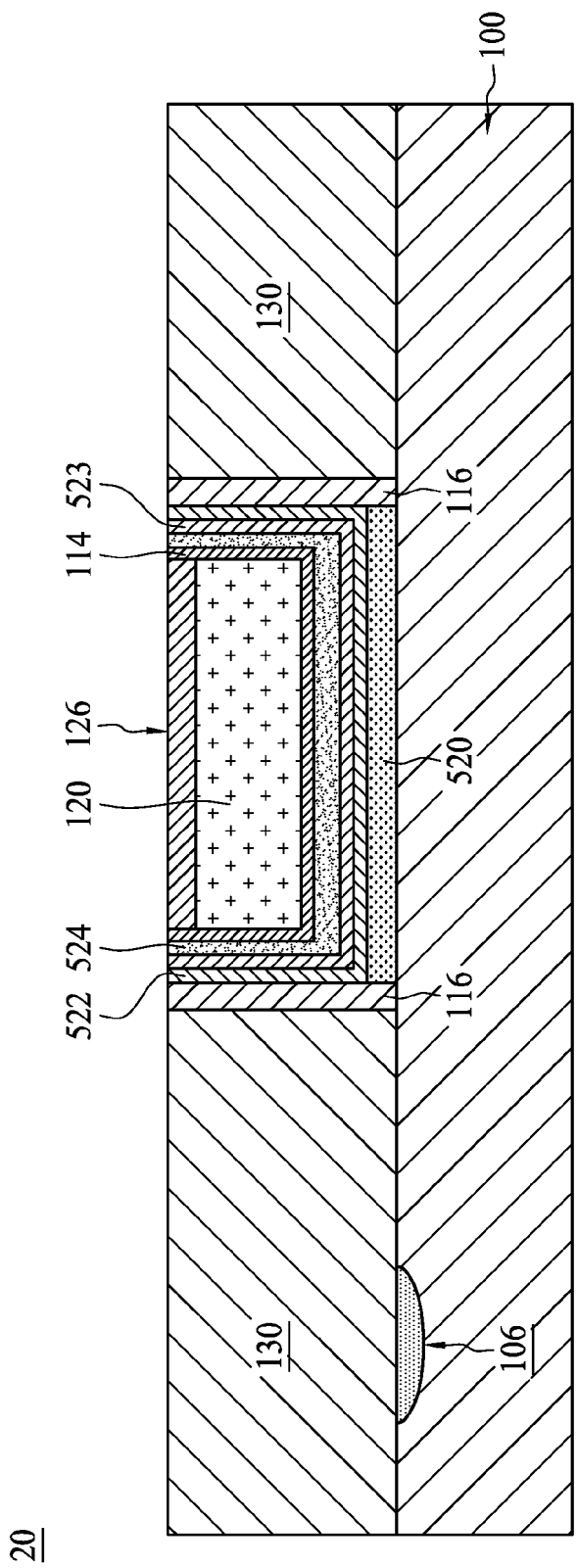

In some embodiments as In FIG. SI, an oxygen treatment is performed on metallic filling layer 120. In some embodiments, the oxygen treatment is a plasma process including an oxygen flow rate ranging from about 10 sccm to about 200 sccm and an RF power ranging from about 100 W to about 1500 W. An oxide 126 of the metallic filling layer 120 is formed as in FIG. 5J. In some embodiments, the metallic filling layer 120 is aluminum, thus the oxide 126 is an aluminum oxide. The oxide 126 has a thickness ranging from about 5 nm to 8 nm. The oxygen treatment operation is skipped for some embodiments in the present disclosure.

Figure 5K:
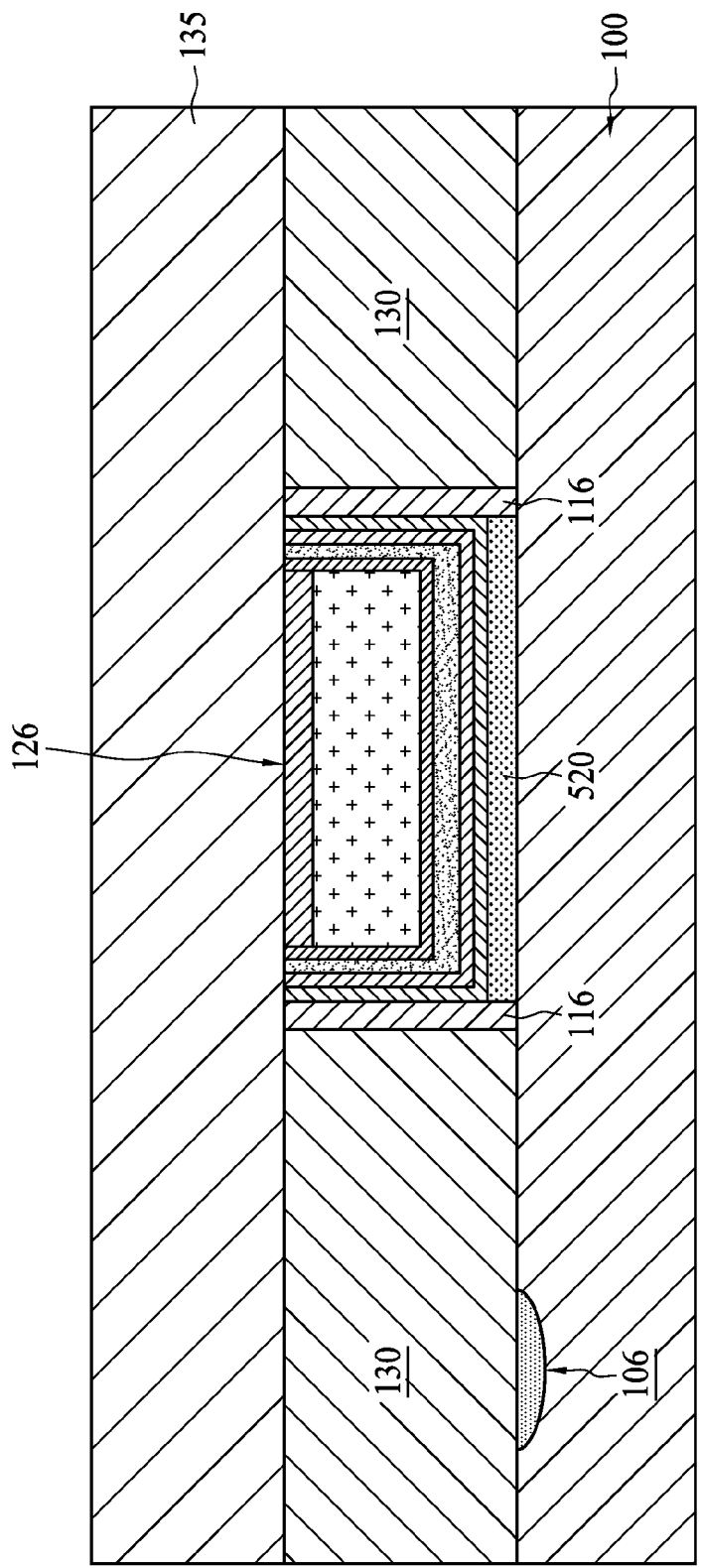

In FIG. 5K, a dielectric film 135 is disposed over the substrate 100. The dielectric 135 (ILD 1) can be a single film as shown in FIG. 5K or a stack to include an etch stop layer and a capping layer (not shown). In some embodiments, the dielectric 135 is formed of oxide, nitride, oxynitride, and low k dielectrics comprising carbon-based, Si-based layers formed by PECVD, SOG or SOD, or combinations thereof. Dielectric 130 and dielectric 135 may be formed of a same material or different materials.

Figure 5L:
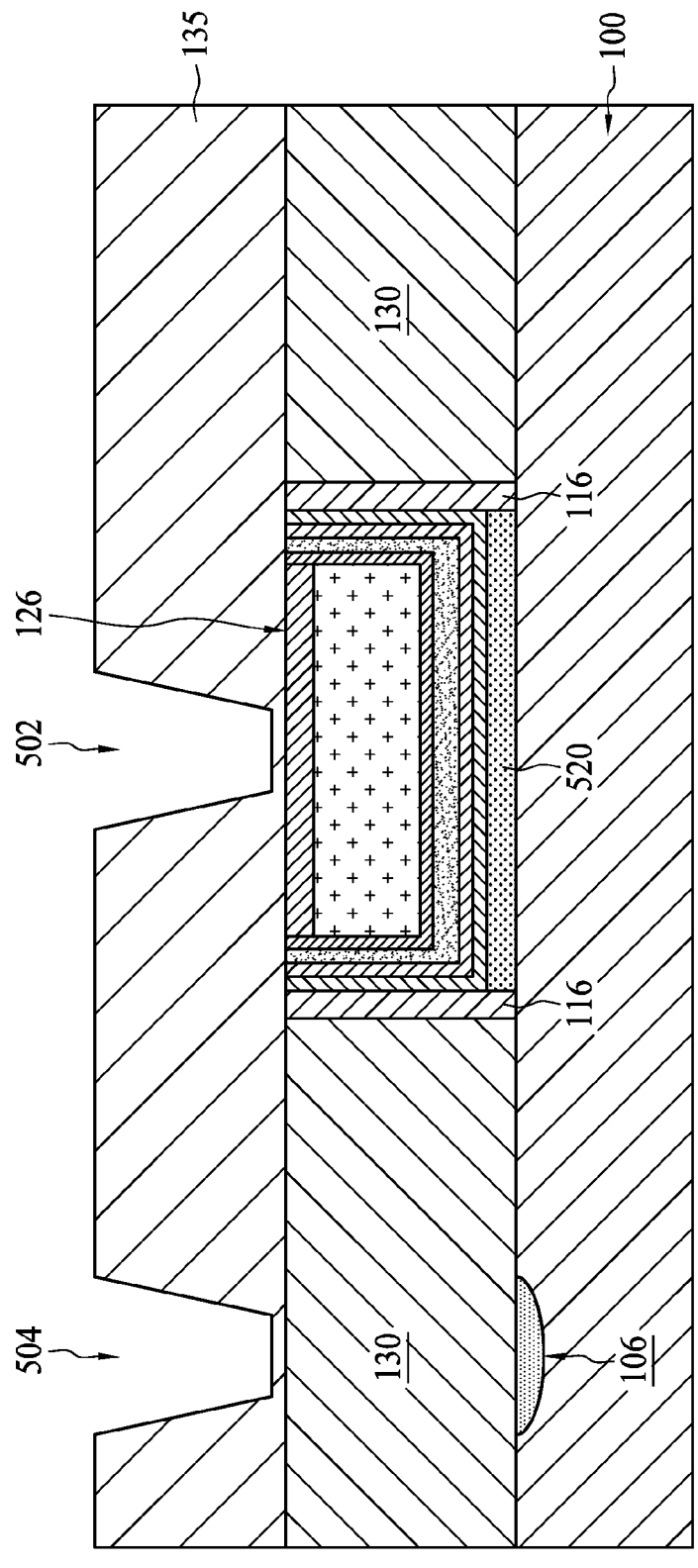
Figure 5M:
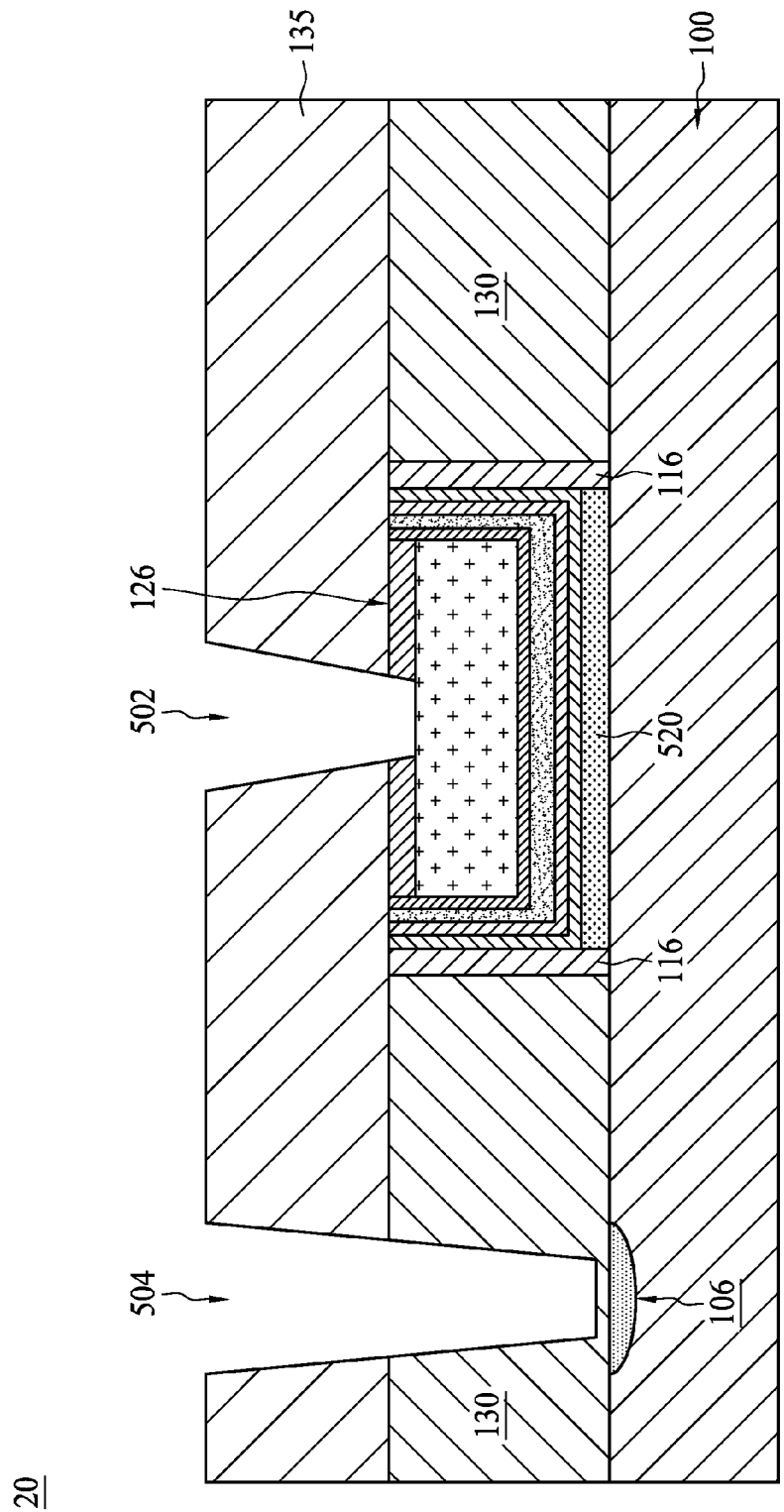

A first etch operation is performed to form contact holes in the dielectric 130. In some embodiments, the first etch includes two steps. One of the two steps is a main etch step as in FIG. 5L. A contact opening 502 is formed over the metal gate structure and a contact opening 504 is formed over a buried diffusion area. The main etch stops before the metal oxide 126 exposes and a portion of second dielectric 135 still remains in the contact opening 502. After the main etch step is an over etch step. During the over etch, contact opening 502 extends to break through metal oxide 126 and exposes the top surface of metallic filling layer 120 as in FIG. 5M. Contact opening 504 also extends further into dielectric 130 to form a deeper opening Some dielectric 130 remains in the contact opening 504 and covers the top surface of the substrate 100. In some embodiments, the first etch operation is performed under an RF power ranges from about 2000 W to about 4000 W.

The silicide region 106 is formed before the dielectric 130 is disposed on the substrate. In some embodiments, a nickel silicide layer, $NiSi_x$ is formed on the substrate 100 after the substrate 100 exposes in contact opening 504. The nickel silicide herein are often nonsoichiometric, thus a subscript "x" for the silicon composition is used in the present disclosure. Preparation for nickel silicide formation is via formation of a thin, titanium layer. The presence of titanium underlying a subsequently deposited nickel layer, allows the anneal procedure used to form metal silicide to be performed at a temperature in which nickel silicide will not agglomerate or become unstable. However to be effective in reducing nickel silicide instability during the metal silicide formation anneal procedure the titanium interlayer is maintained at a minimum thickness of ranging from about 10 to about 15 Angstroms, with excellent thickness uniformity. To insure the uniformity of the thin, titanium interlayer, an atomic layer deposition (ALD) procedure is employed to form titanium interlayer, at a thickness ranging from about 10 to about 15 Angstroms, with the ALD procedure providing the desired titanium comformality and thickness uniformity. (can be formed after contact open)

Nickel layer, is formed on the substrate 100 via physical vapor deposition (PVD) procedures such as RF sputtering or evaporation, at a thickness ranging from about 50 to about 500 Angstroms. An initial phase of an RTA procedure is next performed a temperature ranging from about 250 to about 700 degrees Celsius, resulting in the formation of an annealed layer, wherein the annealed layer is comprised of only nickel and incorporated titanium interlayer component. Continuation of the RTA procedure, again performed at a temperature ranging from about 250 to about 700 degrees Celsius, results in the formation of nickel silicide region, Portions of nickel silicide region remain unreacted.

Removal of unreacted nickel silicide, the nickel-titanium layer, is next selectively accomplished via wet etch procedures using a mixture comprised of H2SO4-H2O2-HCl—NHOH4-H3PO4-HNO3-CH3COOH—. The nickel silicide layer, $NiSi_x$, is finally formed. It should be noted that this procedure, the use of a thin titanium interlayer for nickel silicide formation, can also be applied to formation of other metal silicide layers, such as cobalt silicide.

Figure 5N:
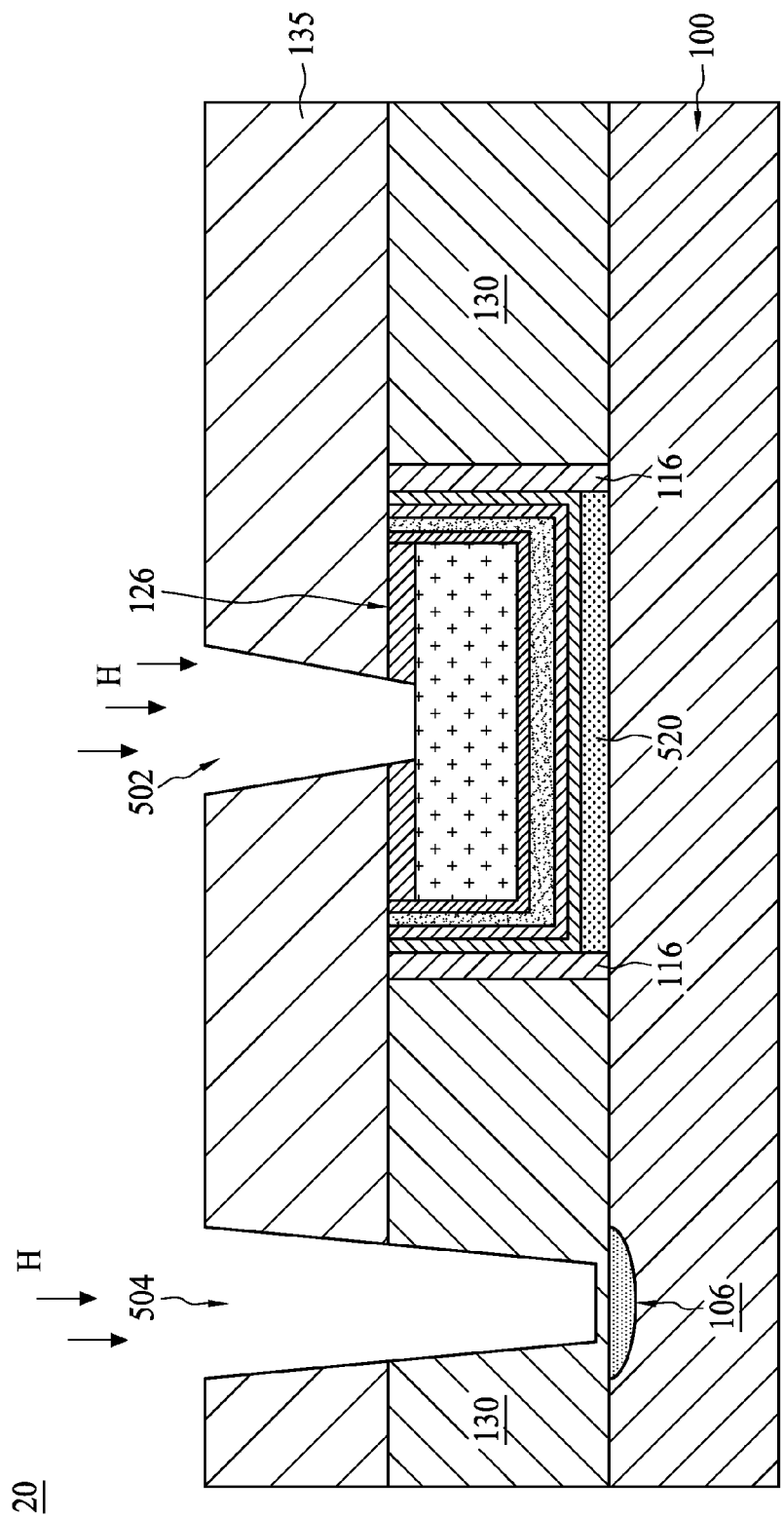

A flush operation is performed after the first etch operation in FIG. 5N. A gas such as $N_2$, $H_2$, $NH_3$, $NH_4$, $N_2H_2$, or other suitable gases is introduced to purge into contact openings 502 and 504. If there is etch residue such as polymer or photoresist remains in the contact openings after the first etch operation, the gas breaks the cross link of the residue and clean the contact openings. In some embodiments, the flush operation is a plasma operation and performed under an RF power in a range about 100 W to about 250 W.

Figure 5O:
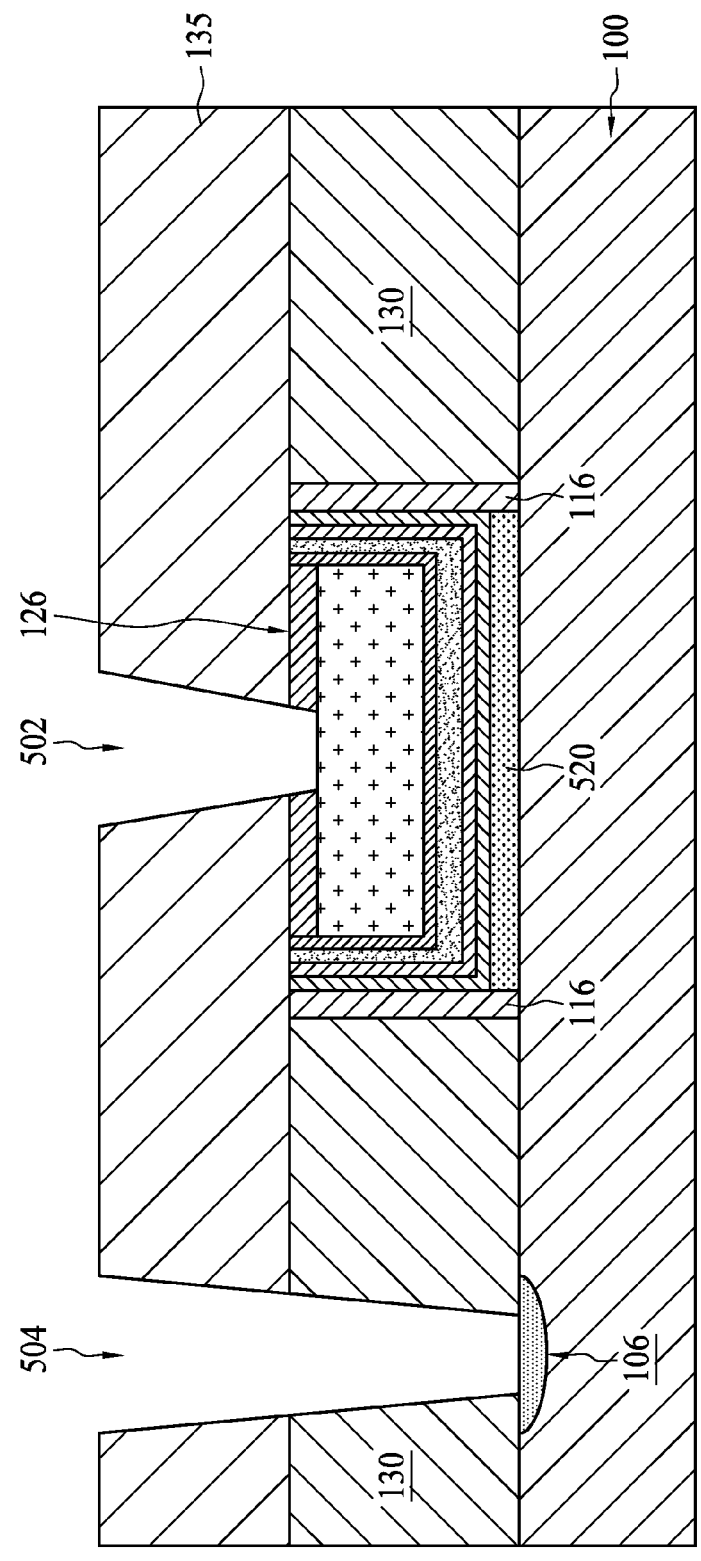

A second etch operation is performed to expose the silicide region 106 as in FIG. 5O. In the second etch operation, the remaining dielectric 130 in contact opening 504 is removed. The second etch operation may use any suitable etching method including, for example, a plasma dry etch, a chemical wet etch, or other processes. For example, the etch process is performed in a dry etching device, using a mixed gas of He, Ar, O2, CF based gases, NF3 and SF6 under the conditions of a gas pressure of 5-50 mTorr and an RF power of 1000-4500 W. In some embodiments, the etching method for first etch operation and second etch operation is same.

Figure 5P:
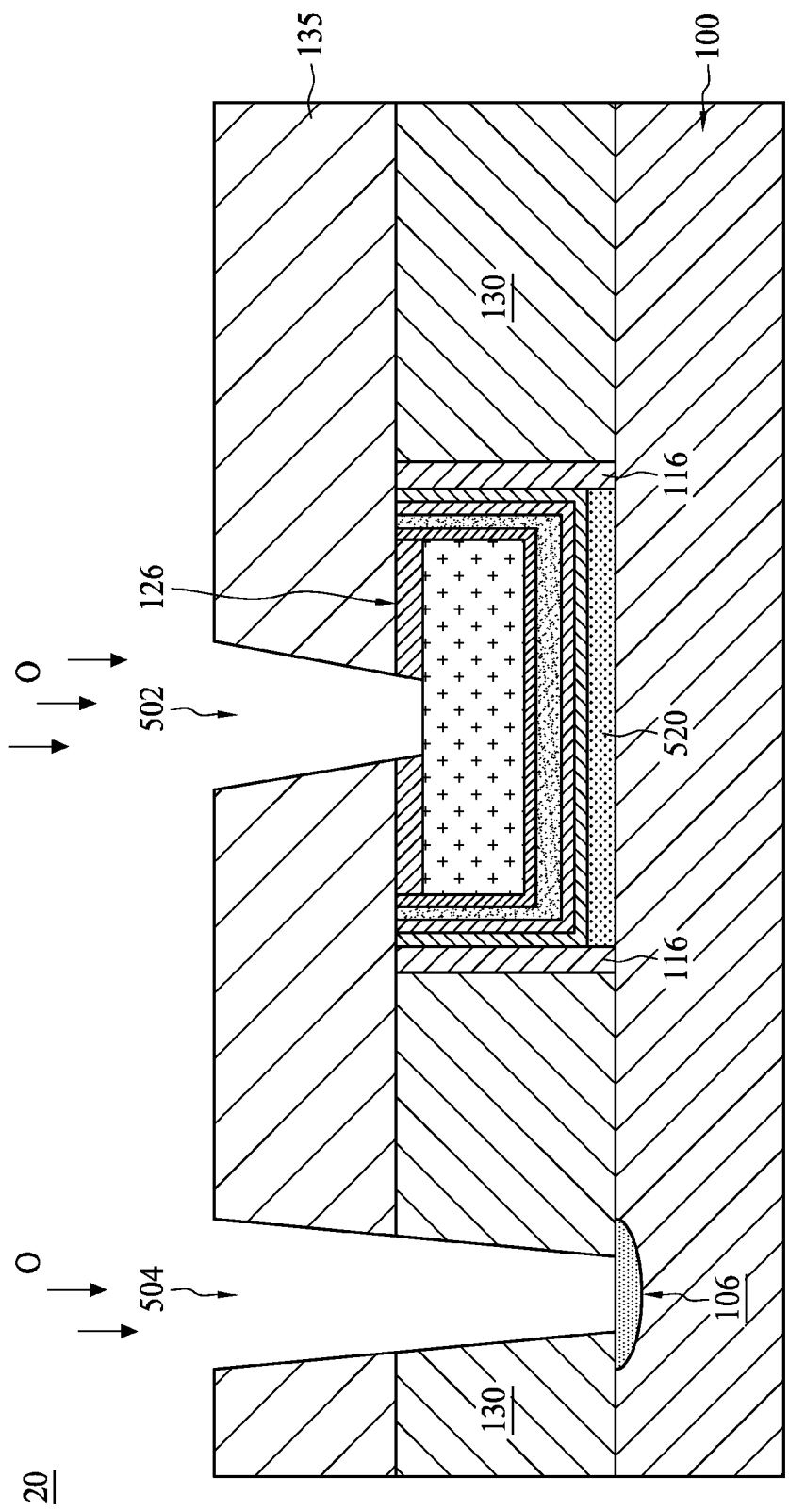

In FIG. 5P, an ashing operation is performed after the second etch operation to strip etching residue. In some embodiments, oxygen is introduced to react with carbon-contained photo residue and some etching under the condition of an RF power of 300-3000 W.

While performing the aforementioned operations on a wafer, the photoresist residue within the contact openings may not be totally removed by the ashing operation. An wet etch is performed by flowing chemical solutions into contact openings 502 and 504 to further clean up photoresist residue trapped in the openings. In some embodiments, the chemical solution includes chemical such as $H_2O_2$, $NH_3$, $H_2O$, or other suitable chemicals. The $H_2O_2$, $NH_3$ are diluted to a predetermined concentration thus the wet etch operation is able to be performed under a controllable rate. The chemical solution may be a mixture of $H_2O_2$, $NH_3$, and $H_2O$ in a ratio ranging from about 1:1:500 to about 1:1:160. In some embodiments, the chemical solution is a mixture of $H_2O_2$, $NH_3$, and $H_2O$ in a ratio ranging from about 1:1:50 to about 1:1:500. In some embodiments, the chemical solution is a mixture of $H_2O_2$, $NH_3$, and $H_2O$ in a ratio ranging from about 1:1:100.

Figure 5Q:
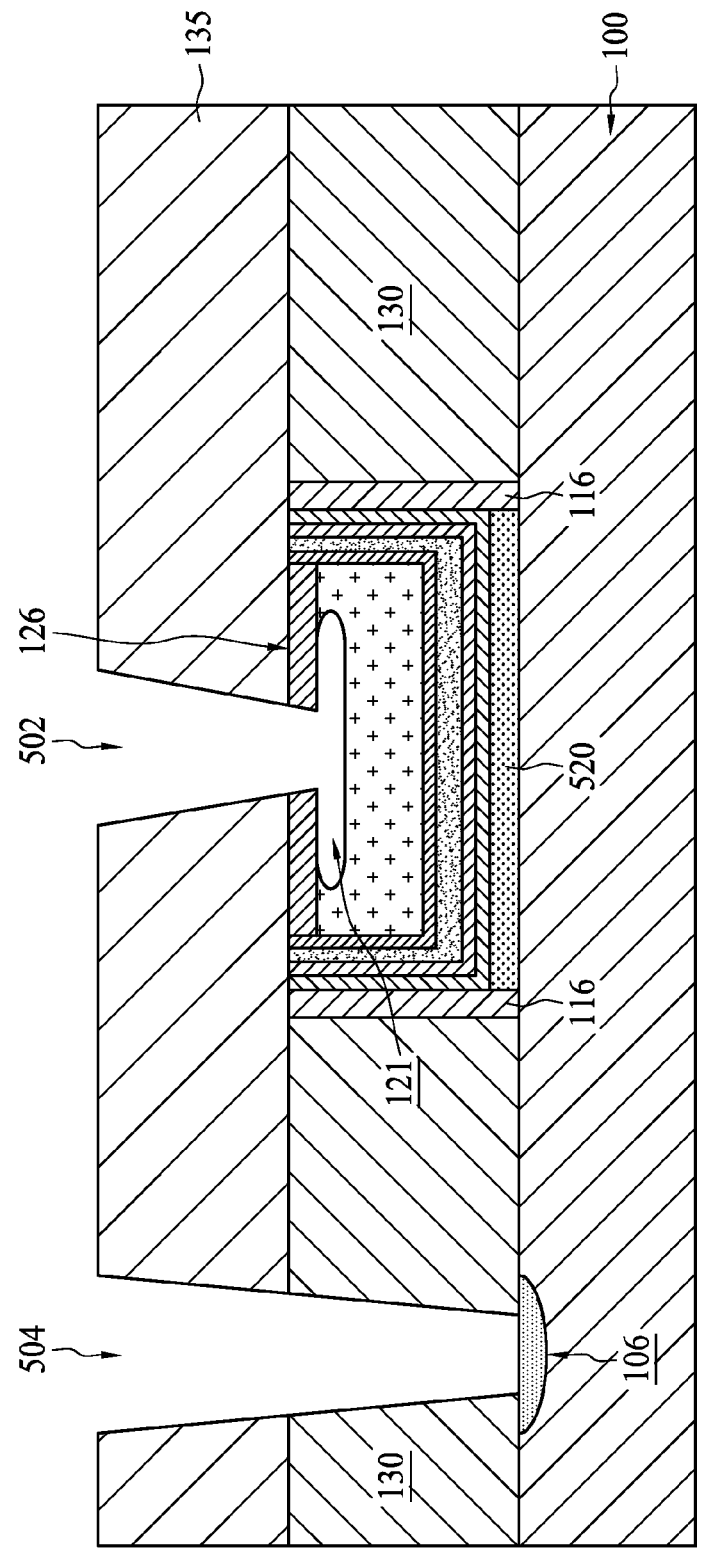

The wet etch operation has a high selectivity between the metal oxide 126 and metallic filling layer 120. Because the chemical solution is designed to etch the material of the metallic filling layer 120, a recess is formed on the top surface 121 of metallic filling layer 120 as in FIG. 5Q. The recess extends into the metallic layer 120 and further extends under the metal oxide 126. In some embodiments, the wet etch is isotropic hence the recess has a circular empty space on the top of the metallic layer filling 120. The corner of the recess has an arc edge interfacing with the metallic filling layer 120.

The wet etch efficiently removes photoresist residue trapped in the contact opening and ensure there is no undesired electrical isolative material attached on the exposed metallic filling layer 120. In some embodiments, the wet etch time is ranging from about 5 seconds to about 180 seconds. In some embodiments, the wet etch time is ranging from about 20 seconds to about 180 seconds. The time is controlled to ensure that other layers such as barrier layer 524 is unexposed and protected by the metallic filling layer 120. In some embodiments, the wet etch is introduced in a wafer level process to ensure the contact opening to be free from photoresist residue throughout the wafer. Therefore, there is no blind contact (no contact between metal gate and conductive plug) in the wafer.

Compared to the contact opening 502 on metal gate structure, the silicide region 106 in contact opening 504 is more resistant to wet etch. The silicide region 106 has a very low wet etch rate to the chemical solution including $H_2O_2$, $NH_3$, $H_2O$ thus there is almost no recess on the silicide region 106.

Figure 5R:
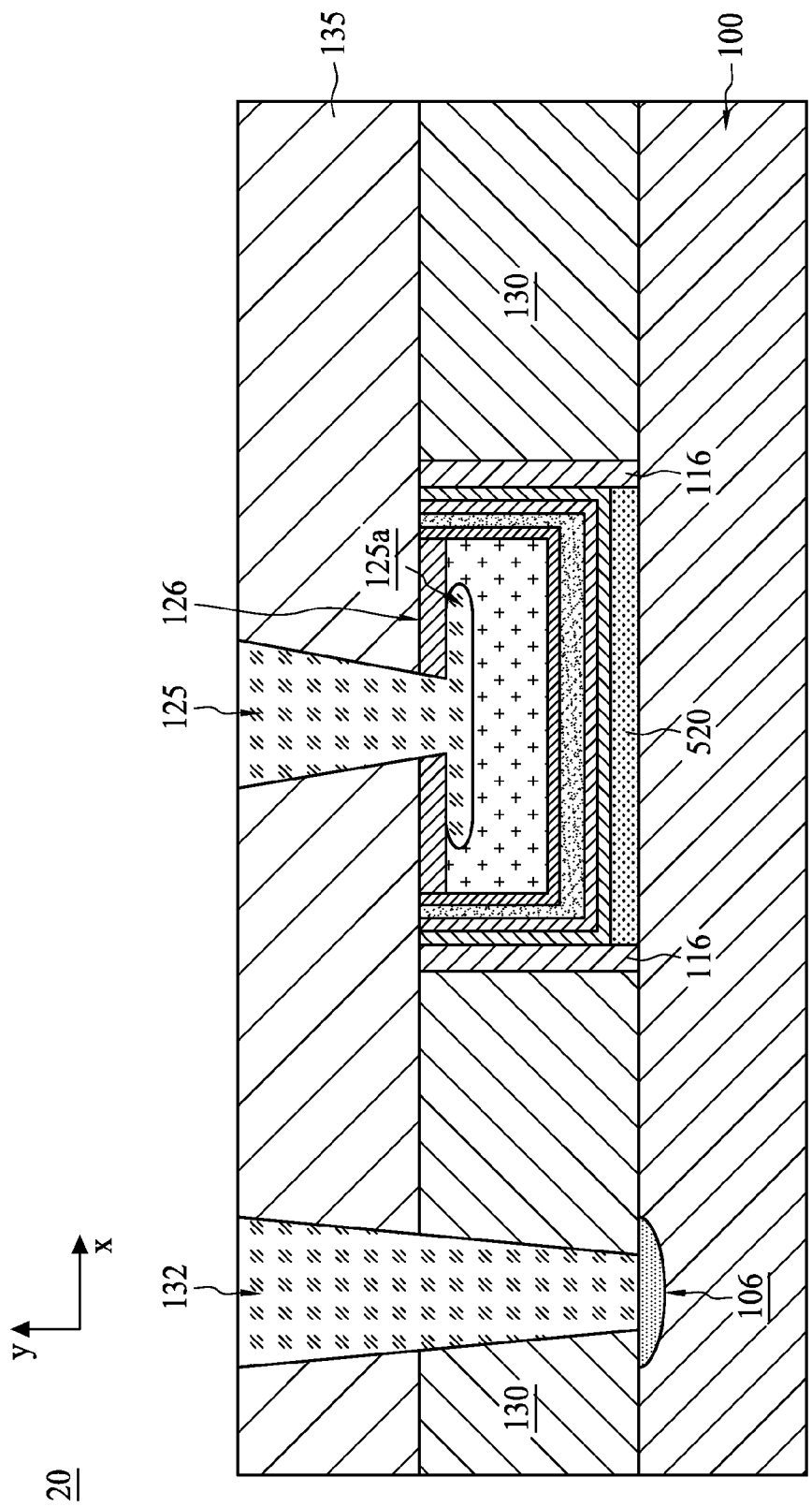
Figure 5S:
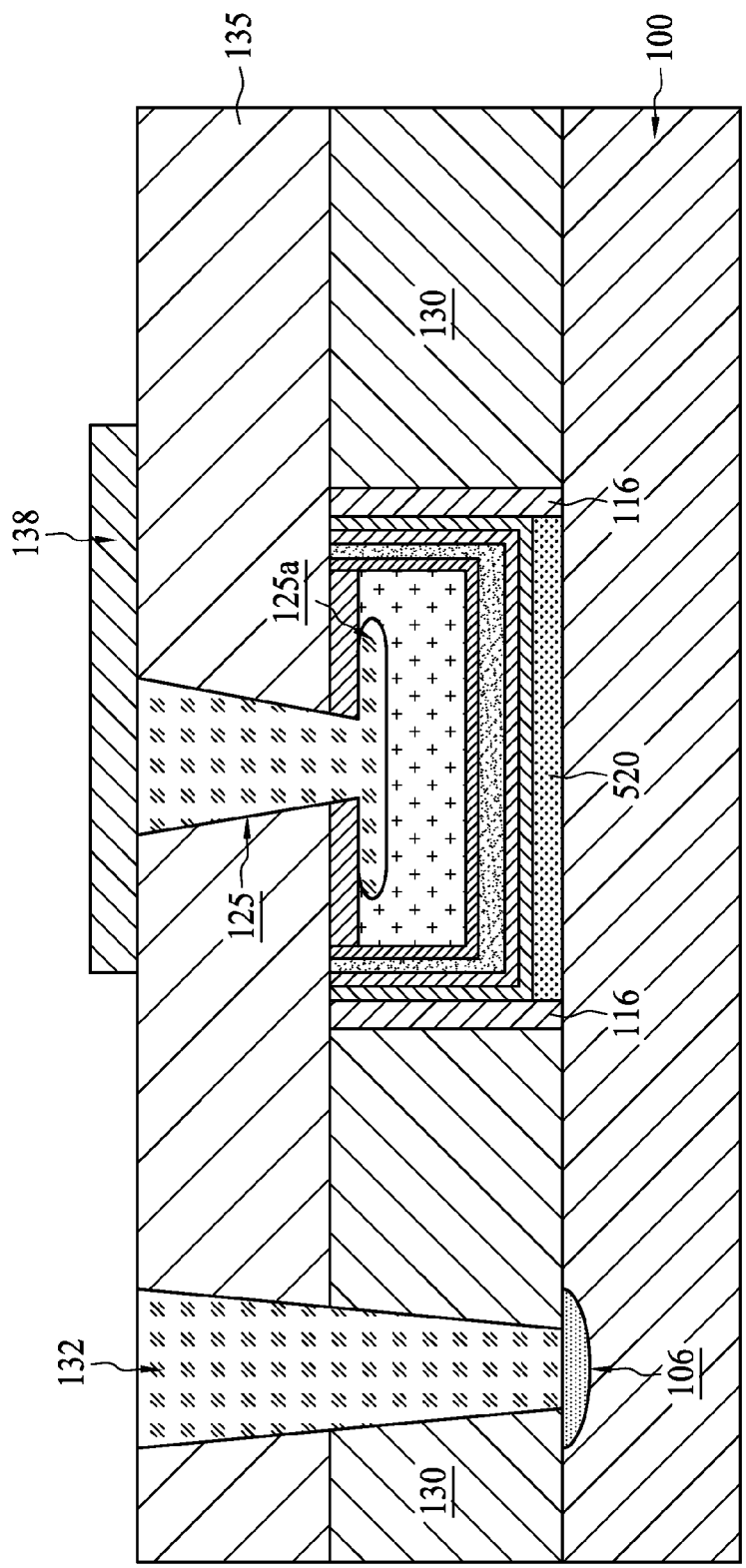

In some embodiments, conductive material fills into contact opening 502 and 504 respectively. In contact opening 502, the conductive material follows the shape of the recess and fills laterally along X-axis as in FIG. 5R to form a reversed T-shape conductive plug 125 accordingly. The conductive plug 125 extends longitudinally through the second dielectric 135 and ends with a lateral encroachment 125a inside the metallic filling layer 120 along X-axis.

A conductive trace 138 is further formed on the second dielectric 135 and connects with the conductive plug 125 and 132 as shown in FIG. 5S. Through the conductive trace and the conductive plug 125, the metal gate is electrically communicating with other circuitry.

As aforementioned, the new contact engineering provided in the various embodiments improves contact resistance between a conductive plug and a metal gate. In the new contact engineering, a reversed T-shaped conductive plug is designed to be in contact with the metal gate. The reversed T-shaped conducive plug is extending laterally in the metal gate in order to increase ohmic contact surface with the metal gate. Moreover, the lateral encroachment of the reversed T-shaped conducive plug anchors the conductive plug in the metal gate. Therefore, in additional to the bottom surface, a sidewall portion of the reversed T-shaped conducive plug is also surrounded by the metal gate such that the device has a lower contact resistance and better physical integrity.

In some embodiments, a semiconductor structure includes a substrate and a metal gate. The metal gate includes a metallic filling layer and disposed over the substrate. The semiconductor structure further includes a dielectric material over the metallic filling layer and separating the metallic filling layer from a conductive trace. The conductive trace is over the dielectric material. The semiconductor structure further includes a conductive plug extending longitudinally through the dielectric material and ending with a lateral encroachment inside the metallic filling layer along a direction. The lateral direction is substantially perpendicular to the longitudinal direction of the conductive plug.

In some embodiments, a semiconductor structure includes a substrate and the substrate has a silicide region. The semiconductor structure also includes a metal gate over the substrate and a metallic filling layer with a recessed top surface. The semiconductor structure further includes a conductive material contacting with the recessed top surface and extending out the metal gate with a reduced diameter.

In some embodiments, a method of manufacturing a semiconductor structure includes several operations. One of the operations is providing a substrate. One of the operations is forming a metal gate structure on the substrate. One of the operations is disposing a first dielectric on the substrate. One of the operations is disposing a second dielectric over the metal gate structure and the substrate. One of the operations is performing a first etch in the first dielectric material thereby exposing a top surface of a metallic material in the metal gate structure. One of the operations is performing a second etch in the second dielectric thereby exposing a silicide region of the substrate. One of the operations is performing a wet etch to remove a portion of the metallic material from the top surface thereby forming a lateral recess under the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    a metal gate including a metallic filling layer and disposed over the substrate;
    a dielectric material over the metallic filling layer and separating the metallic filling layer from a conductive trace over the dielectric material; and
    a conductive plug extending longitudinally through the dielectric material and ending with a lateral encroachment inside the metallic filling layer along a lateral direction substantially perpendicular to the longitudinal direction of the conductive plug.

2. The semiconductor structure of claim 1, further comprising an oxide of the metallic filling layer between the dielectric material and the metallic filling layer.

3. The semiconductor structure of claim 2, wherein the oxide of the metallic filling layer is on the lateral encroachment.

4. The semiconductor structure of claim 1, wherein the lateral encroachment is symmetric to the conductive plug.

5. The semiconductor structure of claim 1, wherein the lateral encroachment has a rounded end interfaced with the metallic filling layer.

6. The structure of claim 1, wherein the conductive plug extends longitudinally into the metallic filling layer of a depth ranging from about 0.5 nm to about 15 nm.

7. The structure of claim 1, wherein the lateral encroachment includes a width along the lateral direction smaller than about 50 nm.

8. The structure of claim 1, wherein the substrate includes a fin structure and the metal gate is disposed on the fin structure.

9. A semiconductor structure, comprising:

a substrate;

a metal gate including a metallic filling layer, disposed over the substrate, a top of the metallic filling layer comprising a flat surface and a recessed surface connected to the flat surface;

a reverse T-shaped conductive plug, comprising a laterally-extending end disposed on the recessed surface of the metallic filing layer, and an upper dielectric material over the metallic filling layer, surrounding the reverse T-shaped conductive plug.

10. The structure of claim 9, further comprising a lower dielectric material surrounding the metal gate and the metallic filling layer.

11. The structure of claim 10, further comprising a conductive plug disposed on the substrate, longitudinally extending through the upper dielectric material and the lower dielectric material.

12. The structure of claim 11, wherein the reverse T-shaped conductive plug extends longitudinally into the metallic filling layer with a first depth ranging from about 0.5 nm to about 15 nm.

13. The structure of claim 12, wherein the conductive plug extends longitudinally into the substrate with a second depth, a ratio of the first depth and the second depth being in a range of from about 10 to about 100.

14. The structure of claim 11, wherein the conductive plug is disposed on a silicide region of the substrate.

15. The structure of claim 10, further comprising an etch stop layer between the upper dielectric material and the lower dielectric material.

16. The structure of claim 9, further comprising an oxide of the metallic filling layer between the upper dielectric material and the metallic filling layer.

17. A semiconductor structure, comprising:

a substrate;

a metal gate including a metallic filling layer disposed over the substrate;

an upper dielectric material over the metallic filling layer and separating the metallic filling layer from a conductive trace over the upper dielectric material; and a conductive plug extending longitudinally through the upper dielectric material and ending in the metallic filling layer, the conductive plug comprising:

an upper portion above an interface between the metallic filling layer and the upper dielectric layer; and a bottom portion under the interface, and wherein a first width of the bottom portion is greater than a second width of the upper portion, the second width being a lateral dimension half height of the upper portion.

18. The structure of claim 17, wherein half of the difference between the first width and the second width is smaller than about 50 nm.

19. The structure of claim 17, wherein a top view of the upper portion of the conductive plug comprises a quadrilateral shape and a top view of the lower portion of the conductive plug comprises a circular shape.

20. The structure of claim 17, wherein a top view of the upper portion and the lower portion of the conductive plug comprises a same shape.

* * * * *